United States Patent
Tao et al.

(10) Patent No.: US 11,437,781 B2
(45) Date of Patent: Sep. 6, 2022

(54) DISTRIBUTED FEEDBACK (DFB) LASER ON SILICON AND INTEGRATED DEVICE COMPRISING A DFB LASER ON SILICON

(71) Applicant: QUALCOMM Incorporated, San Diego, CA (US)

(72) Inventors: Gengming Tao, San Diego, CA (US); Bin Yang, San Diego, CA (US); Xia Li, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 185 days.

(21) Appl. No.: 16/803,668

(22) Filed: Feb. 27, 2020

(65) Prior Publication Data

US 2021/0273409 A1 Sep. 2, 2021

(51) Int. Cl.
*H01S 5/12* (2021.01)
*H01S 5/02* (2006.01)
(Continued)

(52) U.S. Cl.
CPC ............... *H01S 5/12* (2013.01); *H01S 5/021* (2013.01); *H01S 5/026* (2013.01); *H01S 5/0207* (2013.01); *H01S 5/0208* (2013.01); *H01S 5/0218* (2013.01); *H01S 5/0261* (2013.01); *H01S 5/3432* (2013.01); *H01S 5/34306* (2013.01); *H01S 5/04257* (2019.08); *H01S 5/3412* (2013.01)

(58) Field of Classification Search
CPC .......... H01S 5/02; H01S 5/021; H01S 5/0218; H01S 5/12–125; H01S 5/3213; H01S 5/3086–309; H01S 5/305–3068
See application file for complete search history.

(56) References Cited

U.S. PATENT DOCUMENTS 6,177,690 B1 * 1/2001 Noguchi ............... H01S 5/347
257/96
9,362,444 B1 6/2016 Leobandung et al.
(Continued)

FOREIGN PATENT DOCUMENTS

JP       11274467 A  * 10/1999  ......... H01L 27/1443
WO    2019146321 A1     8/2019

OTHER PUBLICATIONS

Egawa T., et al., "Monolithically Integrated AlGaAs/InGaAs Laser Diode, P—N Photodetector and GaAs MESFET Grown on Si Substrate", 362 Japanese Journal of Applied Physics, Japan Society Of Applied Physics, JP, vol. 32, No. 1B, Part 1, Tokyo, JP, Jan. 1, 1993 (Jan. 1, 1993), XP000418054, pp. 650-653, ISSN: 0021-4922, DOI: 10.1143/JJAP.32.L650 p. 1-p. 2, figure 2.
(Continued)

*Primary Examiner* — Sean P Hagan
(74) *Attorney, Agent, or Firm* — Loza & Loza, LLP/Qualcomm

(57) ABSTRACT

A distributed feedback (DFB) laser that includes a substrate comprising a first surface and a second surface, wherein the substrate comprises silicon; a plurality of shallow trench isolations (STIs) located over the second surface of the substrate; a grating region located over the plurality of STIs and the substrate, wherein the grating region comprises a III-V semiconductor material; a non-intentional doping (NID) region located over the grating region; and a contact region located over the NID region.

35 Claims, 28 Drawing Sheets

(51) Int. Cl.
  *H01S 5/026* (2006.01)
  *H01S 5/343* (2006.01)
  *H01S 5/042* (2006.01)
  *H01S 5/34* (2006.01)

(56) References Cited

U.S. PATENT DOCUMENTS

| | | | |
|---|---|---|---|
| 9,806,615 | B1 | 10/2017 | Deligianni et al. |
| 9,933,585 | B2 | 4/2018 | Zhang et al. |
| 2008/0029770 | A1* | 2/2008 | Masui ............... B82Y 20/00 257/79 |
| 2008/0187018 | A1* | 8/2008 | Li ...................... H01L 21/02647 372/50.11 |
| 2015/0270684 | A1* | 9/2015 | Suzuki ............... H01S 5/1237 372/45.012 |
| 2018/0048123 | A1 | 2/2018 | Prost et al. |
| 2018/0081114 | A1 | 3/2018 | Li et al. |
| 2018/0183212 | A1 | 6/2018 | Van Campenhout et al. |

OTHER PUBLICATIONS

International Search Report and Written Opinion—PCT/US2021/019646—ISA/EPO—dated Jun. 22, 2021.
Schlereth K-H., et al., "Device Optimization of Laser and Heterobipolar Transistor for Laser/Driver OEIC", Proceedings of the International Conference on Indium Phosphide and Related Materials, Newport, Apr. 21-24, 1992, [Proceedings of the International Conference on Indium Phosphide and Related Materials], New york, IEEE, US, vol. Conf. 4, Apr. 21, 1992 (Apr. 21, 1992), XP000341302, pp. 477-480, DOI: 10.1109/ICIPRM.1992.235560 ISBN: 978-0-7803-0522-9 p. 1; figure 1.
Miagden E.S., et al., "Monolithically-integrated distributed feedback laser compatible with CMOS processing," Optics Express, vol. 25, No. 15, Jul. 2017, 8 pages.

* cited by examiner

DISTRIBUTED FEEDBACK (DFB) LASER ON SILICON AND INTEGRATED DEVICE COMPRISING A DFB LASER ON SILICON

FIELD

Various features relate to distributed feedback (DFB) lasers, but more specifically to DFB lasers on silicon and integrated devices comprising a DFB laser on silicon.

BACKGROUND

FIG. 1 illustrates a laser diode 100. The laser diode 100 includes a first doped semiconductor layer 102, a second doped semiconductor layer 104, a first electrode layer 120, and a second electrode layer 140. The laser diode 100 is configured to convert electrical energy into light. That is, a voltage between the first electrode layer 120 and the second electrode layer 140 may cause photons to be generated from the first doped semiconductor layer 102 and the second doped semiconductor layer 104. While the laser diode 100 can directly convert electrical energy into light, the laser diode 100 may have limited performance capabilities. There is an ongoing need to provide and improve the performance of lasers.

SUMMARY

Various features relate to distributed feedback (DFB) lasers, but more specifically to DFB lasers on silicon and integrated devices comprising a DFB laser on silicon.

One example provides a distributed feedback (DFB) laser that includes a substrate comprising a first surface and a second surface, wherein the substrate comprises silicon; a plurality of shallow trench isolations (STIs) located over the second surface of the substrate; a grating region located over the plurality of STIs and the substrate, wherein the grating region comprises a III-V semiconductor material; a non-intentional doping (NID) region located over the grating region; and a contact region located over the NID region.

Another example provides an integrated device that includes a substrate, a distributed feedback (DFB) laser located over the substrate, and a transistor located over the substrate. The substrate includes a first surface and a second surface. The substrate comprises silicon. The DFB laser includes a plurality of shallow trench isolations (STIs) located over the second surface of the substrate; a grating region located over the plurality of STIs and the substrate, wherein the grating region comprises an III-V semiconductor material; a non-intentional doping (NID) region located over the grating region; and a contact region located over the NID region.

Another example provides an apparatus that includes a substrate, a distributed feedback (DFB) laser located over the substrate, and a transistor located over the substrate. The substrate includes a first surface and a second surface. The substrate comprises silicon. The DFB laser includes a plurality of shallow trench isolations (STIs) located over the second surface of the substrate; means for refractive grating located over the plurality of STIs and the substrate, wherein the means for refractive grating comprises an III-V semiconductor material; a non-intentional doping (NID) region located over the means for refractive grating; and a contact region located over the NID region.

Another example provides a method for fabricating a distributed feedback (DFB) laser. The method for fabricating the DFB laser includes providing a substrate comprising silicon. The method for fabricating the DFB laser includes forming a plurality of shallow trench isolations (STIs) over the substrate. The method for fabricating the DFB laser includes forming a grating region over the plurality of STIs and the substrate, where the grating region comprises an III-V semiconductor material. The method for fabricating the DFB laser includes forming a non-intentional doping (NID) region over the grating region. The method forms a contact region over the NID region.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

The present disclosure describes a distributed feedback (DFB) laser that includes a substrate comprising a first surface and a second surface, wherein the substrate comprises silicon. The DFB laser includes a plurality of shallow trench isolations (STIs) located over the second surface of the substrate. The DFB laser includes a grating region located over the plurality of STIs and the substrate, wherein the grating region comprises a III-V semiconductor material. The DFB laser includes a non-intentional doping (NID) region located over the grating region. The DFB laser includes a contact region located over the NID region. The III-V semiconductor material includes Gallium Arsenide (GaAs) and/or Indium Phosphide (InP). The DFB laser may be implemented as a discrete DFB laser. The DFB laser may be implemented in an integrated device comprising at least one transistor. The DFB laser may be more stable and may have better low noise operation, than a laser without a grating region.

Exemplary Distributed Feedback Laser Having a Substrate Comprising Silicon

Figure 1:
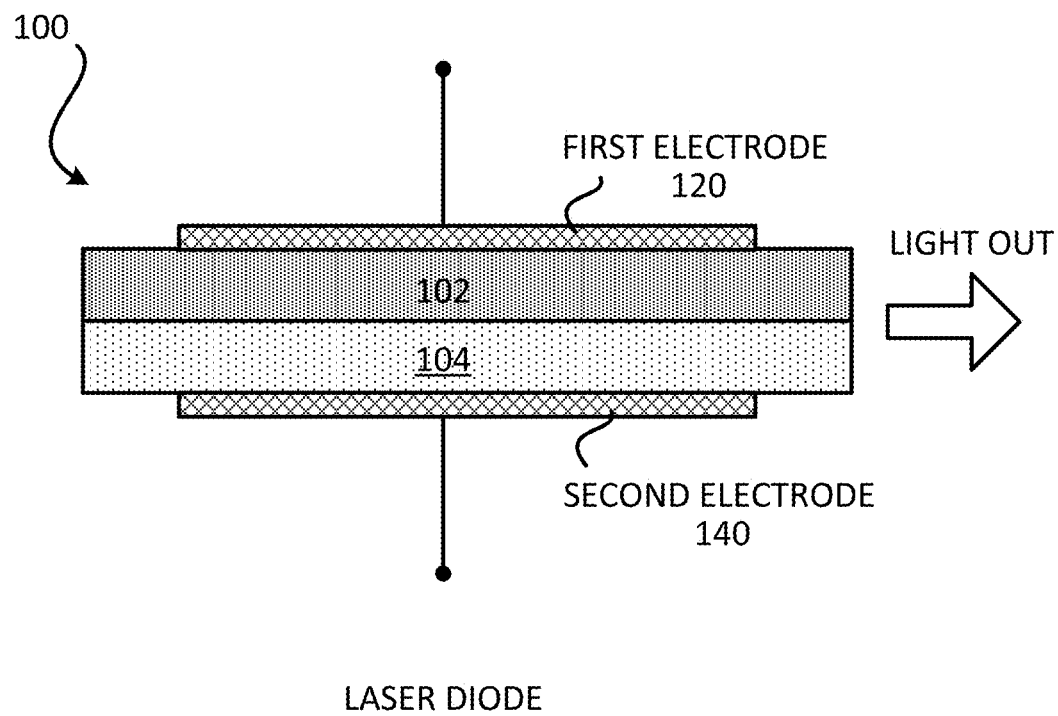
FIG. 1 illustrates a laser diode.
Figure 2:
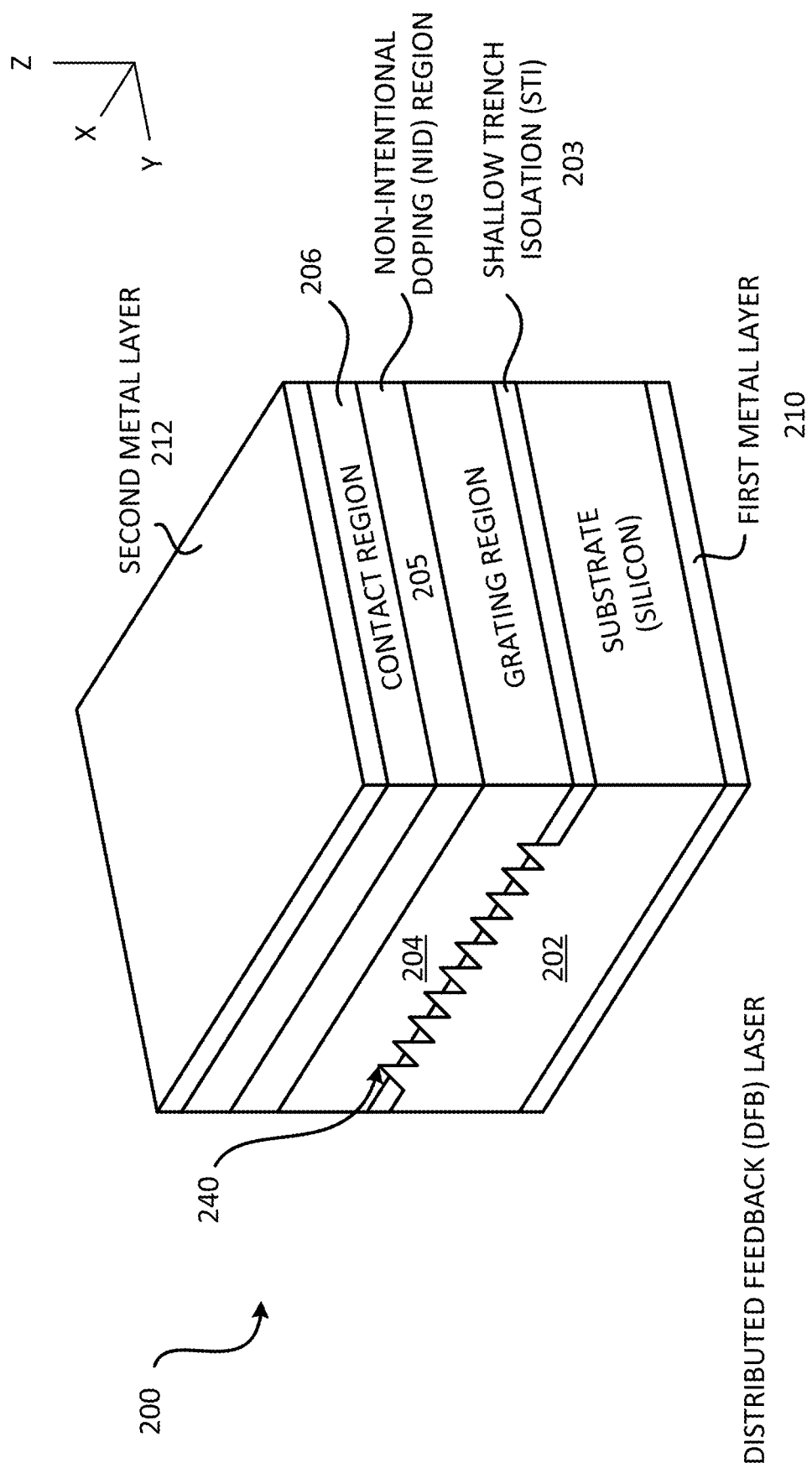
FIG. 2 illustrates a view of an exemplary distributed feedback (DFB) laser comprising a substrate that includes silicon.

FIG. 2 illustrates an example of a distributed feedback (DFB) laser 200 that includes a substrate having silicon. The DFB laser 200 includes a substrate 202, a plurality of shallow trench isolations (STIs) 203, a grating region 204, a non-intentional doping (NID) region 205, a contact region 206, a first metal layer 210 and a second metal layer 212.

The substrate 202 includes silicon (Si). The substrate 202 includes a first surface and a second surface. The plurality of STIs 203 is located over the second surface of the substrate 202. The grating region 204 is located over the plurality of STIs 203 and the substrate 202. The grating region 204 includes an III-V semiconductor material. Examples of III-V semiconductor materials are further described below. The NID region 205 is located over the grating region 204. The NID region 205 may be configured as a waveguide. The contact region 206 is located over the NID region 205. The first metal layer 210 may be located over the first surface of the substrate 202. The second metal layer 212 may be located over the contact region 206. The first metal layer 210 and the second metal layer 212 may be located on opposite sides of the DFB laser 200. Although not shown in FIG. 2, the DFB laser 200 may include one or more voids that are located between the plurality of STIs 203 and the grating region 204.

In some implementations, the DFB laser 200 may be a discrete DFB laser and/or standalone DFB laser. In some implementations, the DFB laser 200 may be implemented in an integrated device next to one or more transistors, which is further described and illustrated below in at least FIG. 11.

The substrate 202 includes silicon. However, in different implementations, the substrate 202 may include other materials, in conjunction with silicon or in lieu of silicon. As will be further described below, the substrate 202 may be undoped or may include a dopant (e.g., N type dopant, P type dopant). The substrate 202 may include semi-insulating materials. Thus, in some implementations, the substrate 202 may be a semi-insulating substrate. Various examples of substrates are further described below.

The plurality of STIs 203 is located over the second surface of substrate 202. The plurality of STIs 203 may include an oxide (e.g., silicon dioxide). The plurality of STIs 203 may represent several STIs, one continuous STI, and/or one contiguous STI. The plurality of STIs 203 is configured to help prevent current leakage. The plurality of STIs 203 may be formed over the second surface of the substrate 202 through a Complementary metal-oxide-semiconductor (CMOS) process. The CMOS process may be part of a front-end-of-line (FEOL) process. As will be further described below, the plurality of STIs 203 may be formed by a deposition process, a lithography process, an etching process, a filling process, a polishing process, and/or a removal process.

The grating region 204 is located over the plurality of STIs 203. Portions of the grating region 204 may also be located between STIs from the plurality of STIs 203. The grating region 204 includes a repeating pattern of shapes and/or surfaces. As shown in FIG. 2, the grating region 204 includes a repeating pattern of ridges 240. In some implementations, the ridges 240 may be identical ridges or similar ridges. The ridges 240 may be spaced apart from each other approximately equally. The ridges 240 may be parallel to each other. The ridges 240 may be elongated along the Y direction. The surfaces of the ridges 240 may be diagonal. As shown in FIG. 2, a repeating pattern of the grating region 204 may include a repeating pattern of diagonal surfaces. The grating region 204 may also include a repeating pattern of vertical surfaces (e.g., along Z axis) and diagonal surfaces. The grating region 204 may be configured as a diffraction grating that provides optical feedback for a laser. The grating region 204 may be configured to provide interference grating (e.g., Bragg scattering). The grating region 204 may cause one or more photons (e.g., light) to be reflected in a certain direction. For example, depending on the design, the grating region 204 may operate like a mirror that selectively reflects only one wavelength of light, which helps reduce the spectral width of the light emitting from the DFB laser. In this example, lights of other wavelengths may not be reflected, resulting in a more focused light (e.g., lower spectral width of light) that emits from the DFB laser. Thus, the grating region 204 helps provide a more stable laser (e.g., laser with reduced spectral width for the light). The grating region 204 may include means for optical feedback. The grating region 204 may include a means for refractive grating. The grating region 204 may include means for interference grating. In some implementations, refractive grating is an example of optical feedback. In some implementations, interference grating is an example of refractive grating.

The grating region 204 includes one or more III-V semiconductor materials. Examples of III-V semiconductor materials include Gallium Arsenide (GaAs), Aluminum Gallium Arsenide (AlGaAs), Indium Phosphide (InP). The III-V semiconductor materials may include N-type or P-type dopants (e.g., dopant material). The grating region 204 may be doped with a N-type dopant or a P-type dopant. In some implementations, the grating region 204 may be undoped. The grating region 204 may include one or more layers of the III-V semiconductor material(s). That is, in some implementations, the grating region 204 may be defined by one or more layers of the III-V semiconductor material(s). The grating region 204 may be formed over the plurality of STIs 203 and the substrate 202 through an epitaxial growth process (e.g., epi process).

As will be further described below in at least FIG. 4, the DFB laser 200 may include one or more voids between the grating region 204 and the plurality of STIs 203.

The NID region 205 is located over the grating region 204. The NID region 205 may be configured as a waveguide. The NID region 205 may be a means for waveguide. The NID region 205 is configured to emit a light from the photons that are generated in the DFB laser 200. When a voltage is applied between the first metal layer 210 and the second metal layer 212, photons may be generated between the grating region 204, the NID region 205 and/or the contact region 206. The photons may reflect and/or refract in the NID region 205, the grating region 204 and/or the contact region 206. In some implementations, some or all of the grating region 204 may be considered part of the NID region 205. For example, at least part of the NID region 205 could be unintentionally doped with a dopant that is similar to a dopant in the grating region 204 (if the grating region 204 is doped with a dopant). Thus, in some implementations, at least part of the NID region 205 could be considered part of the grating region 204.

The NID region 205 includes one or more III-V semiconductor materials. Examples of III-V semiconductor materials include Gallium Arsenide (GaAs), Aluminum Gallium Arsenide (AlGaAs), Indium Phosphide (InP). The III-V semiconductor materials may include N-type or P-type dopants. The NID region 205 may be doped with a N-type dopant or a P-type dopant. In some implementations, the NID region 205 may be undoped. The NID region 205 may include a quantum well (QW) structure and/or a quantum dot (QD) structure. The NID region 205 may include one or more layers of the III-V semiconductor material(s), one more of the QW structures and/or one or more of the QD structures. That is, in some implementations, the NID region 205 may be defined by one or more layers of the III-V semiconductor material(s), one more of the QW structures and/or one or more of the QD structures. The NID region 205 may be formed over the grating region 204 through an epitaxial growth process (e.g., epi process). The NID region 205 may be a region that is configured not to include a dopant. However, in some implementations, the process of fabricating the NID region 205 may be contaminated by at least one dopant, and/or the NID region 205 may be contaminated by one or more dopant due to the fact that the NID region 205 is near and/or adjacent to a region that is configured to include one or more dopant. Thus, for example, a particular region near and/or adjacent to the NID region 205 may be doped, and the process of doping that particular region may result in at least part of the NID region 205 to be doped as well.

The contact region 206 is located over the NID region 205. The contact region 206 may be configured to generate photons when a voltage is applied between the first metal layer 210 and the second metal layer 212.

The contact region 206 includes one or more III-V semiconductor materials. Examples of III-V semiconductor materials include Gallium Arsenide (GaAs), Aluminum Gallium Arsenide (AlGaAs), Indium Phosphide (InP). The III-V semiconductor materials may include N-type or P-type dopant. The contact region 206 may be doped with a N-type dopant or a P-type dopant. In some implementations, the contact region 206 may be undoped. The NID region 205 may include one or more layers of the III-V semiconductor material(s). That is, in some implementations, the contact region 206 may be defined by one or more layers of the III-V semiconductor material(s). The contact region 206 may be formed over the NID region 205 through an epitaxial growth process (e.g., epi process).

FIG. 2 further illustrates that the first metal layer 210 is located over a first surface (e.g., bottom surface) of the substrate 202, and that the second metal layer 212 is located over the contact region 206. In some implementations, the contact region 206 is configured to enable the second metal layer 212 to be able to couple to a semiconductor material of the DFB laser 200. The first metal layer 210 is configured as a first electrode or a first terminal of the DFB laser 200. The second metal layer 212 is configured as a second electrode or a second terminal of the DFB laser 200. Different implementations may use the same materials or different materials for the first metal layer 210 and the second metal layer 212. A plating process may be used to form the first metal layer 210 and/or the second metal layer 212. However, other implementations may use other processes to form the first metal layer 210 and/or the second metal layer 212.

It is noted that the listing of materials for the III-V semiconductor material group is merely exemplary. The III-V semiconductor material group includes other materials and/or combinations of materials. One of ordinary skill in the art will appreciate and understand that any materials that is considered part of the III-V semiconductor material group may be used in the present disclosure.

Figure 3:
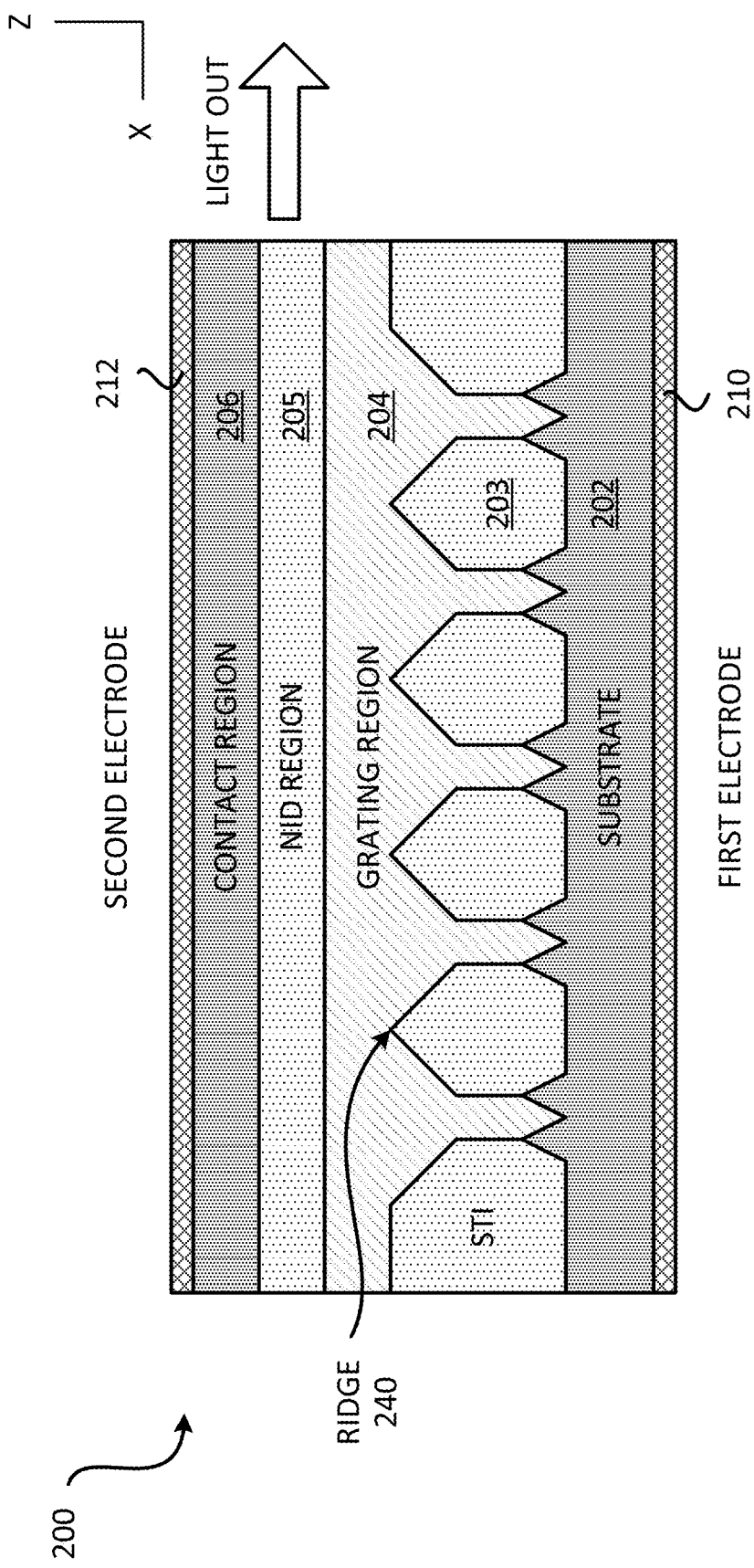
FIG. 3 illustrates a profile view of an exemplary distributed feedback (DFB) laser comprising a substrate that includes silicon.

FIG. 3 illustrates a profile view of the DFB laser 200. As shown in FIG. 3, the DFB laser 200 includes the substrate 202, the plurality of STIs 203, the grating region 204, the NID region 205, the contact region 206, the first metal layer 210 and the second metal layer 212. The substrate 202 may include silicon (Si). The plurality of STIs 203 is coupled to the substrate 202 such that the plurality of STIs 203 is located over a second surface of the substrate 202. The grating region 204 is coupled to the plurality of STIs 203 such that the grating region 204 is located over the plurality of STIs 203. Portions of the grating region 204 may be coupled to and located over the substrate 202. The NID region 205 is coupled to the grating region 204 such that the NID region 205 is located over the grating region 204. In some implementations, the NID region 205 may include the grating region 204. Thus, in some implementations, the grating region 204 may be considered part of the NID region 205. The contact region 206 is coupled to the NID region 205 such that the contact region 206 is located over the NID region 205. The first metal layer 210 is coupled to the first surface of the substrate 202. The second metal layer 212 is coupled to the contact region 206.

As shown in FIG. 3, the DFB laser 200 is configured such that light emits from the NID region 205 in a certain direction. It is noted that the DFB laser 200 may be configured in such a way that light may emit from the NID region 205 in a different direction and/or a different angle. In some implementations, light may emit from other components (e.g., grating region 204, contact region 206) of the DFB laser 200. The properties (e.g., wavelength) of the light that is emitted may vary based on the materials, shapes, dimensions and/or configurations that are used in the DFB laser 200.

FIG. 3 illustrates an example of the shape of the grating region 204. However, the grating region 204 may have different shapes, dimensions, and/or configurations. As shown in FIG. 3, the grating region 204 includes a repeating pattern of ridges 240. In some implementations, the ridges 240 may be identical ridges or similar ridges. The ridges 240 may be spaced equally (or approximately equally) apart from each other. The ridges 240 may be parallel (or approximately parallel) to each other. The ridges 240 may be elongated along the Y direction. The surfaces of the ridges 240 may be diagonal. As shown in FIG. 3, a repeating pattern of the grating region 204 may include a repeating pattern of diagonal surfaces. The grating region 204 may also include a repeating pattern of vertical surfaces and diagonal surfaces. The grating region 204 may be configured as a diffraction grating that provides optical feedback for a laser. The grating region 204 may be configured to provide interference grating (e.g., Bragg scattering). The grating region 204 may cause one or more photons (e.g., light) to be reflected in a certain direction. For example, depending on the design, the grating region 204 may operate like a mirror that selectively reflects only light with a certain wavelength, which helps reduce the spectral width of the light emitting from the DFB laser. In this example, lights of other wavelengths may not be reflected, resulting in a more focused light (e.g., lower spectral width of light) that emits from the DFB laser. Thus, the grating region 204 helps provide a more stable laser (e.g., laser with reduced spectral width for the light). Light with wavelength(s) that are reflected and not reflected will depend on the design, shape and/or size of the grating region 204. For example, light with wavelength(s) that are reflected and not reflected may depend on the spacing between ridges, the number of ridges, the angle(s) of the ridges, the shape of the ridges and/or the material(s) used for the grating region 204. Examples of shapes for the ridges and/or the repeating pattern include, but not limited to, a triangular shape, a rectangular shape and/or a square shape. The grating region 204 may include means for optical feedback. The grating region 204 may include a means for refractive grating. The grating region 204 may include means for interference grating. In some implementations, refractive grating is an example of optical feedback. In some implementations, interference grating is an example of refractive grating.

Figure 4:
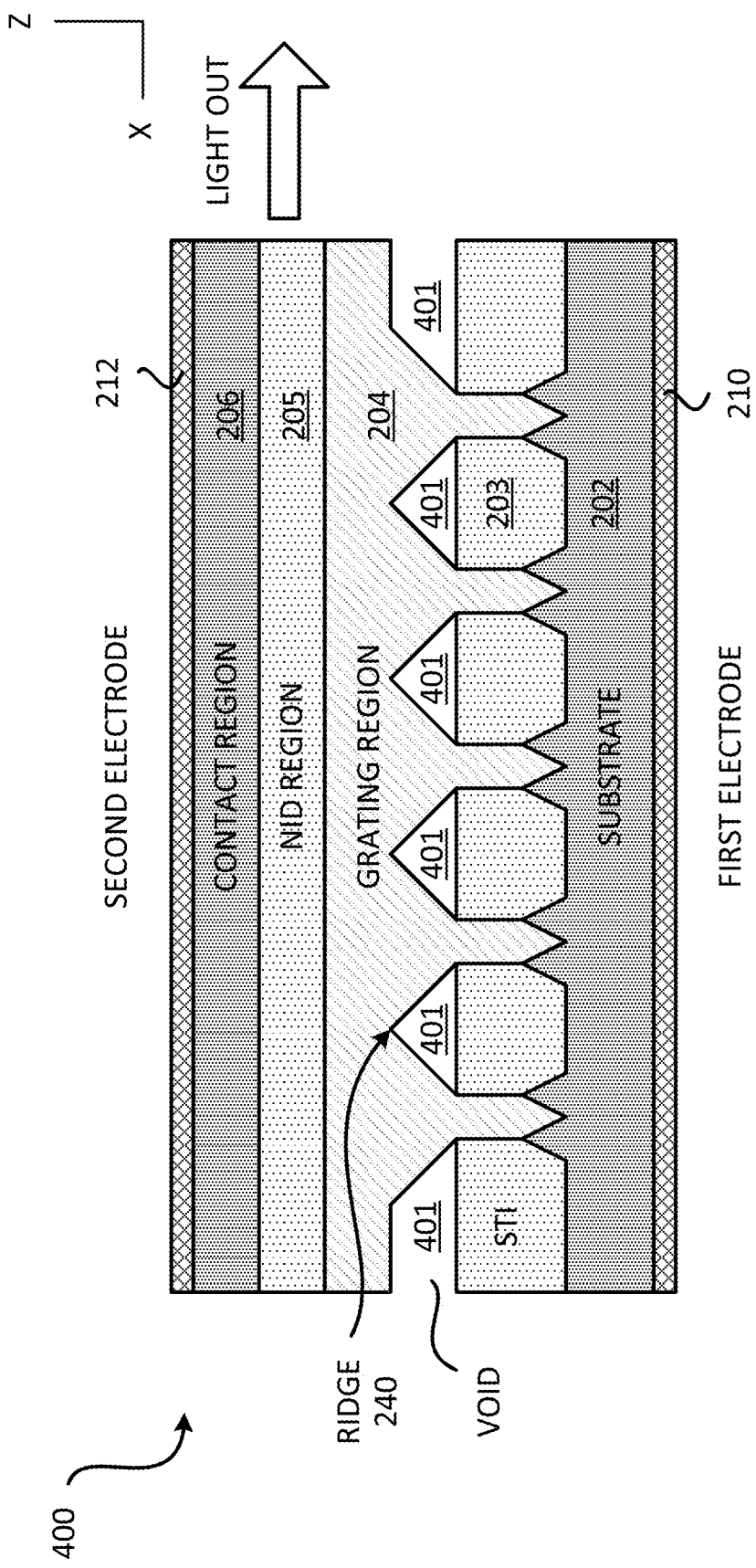
FIG. 4 illustrates a view of an exemplary distributed feedback (DFB) laser comprising a void and a substrate that includes silicon.

FIG. 4 illustrates a profile view of a DFB laser 400. The DFB laser 400 is similar to the DFB laser 200 of FIG. 3. The DFB laser 400 may include the same or similar components as the DFB laser 200, and may operate the same or in a similar manner as the DFB laser 200. As shown in FIG. 4, the DFB laser 400 includes the substrate 202, the plurality of STIs 203, a plurality of voids 401, the grating region 204, the NID region 205, the contact region 206, the first metal layer 210 and the second metal layer 212.

The plurality of voids 401 may be a space that is free of a solid material. The plurality of voids 401 may be located over the plurality of STIs 203. The plurality of voids 401 may be located between the plurality of STIs 203 and the grating region 204. For example, there may be at least one void over at least one STI, and/or there may be at least one void located between at least one STI and the grating region 204. The plurality of voids 401 may represent several voids or one continuous void. In some implementations, the plurality of voids 401 may help the grating region 204 provide improved refraction. In some implementations, the plurality of voids 401 may be an artifact of the fabrication process used to fabricate the DFB laser 400. Different implementations may have voids with different shapes and/or sizes.

Figure 5:
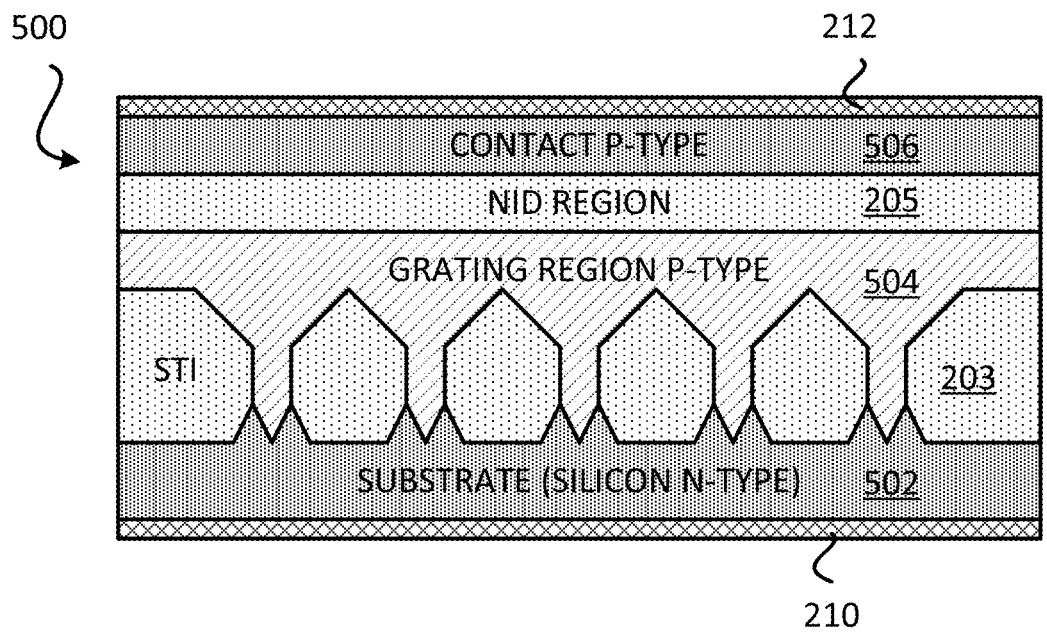
FIG. 5 illustrates a view of an exemplary distributed feedback (DFB) laser comprising a substrate that includes silicon.
Figure 6:
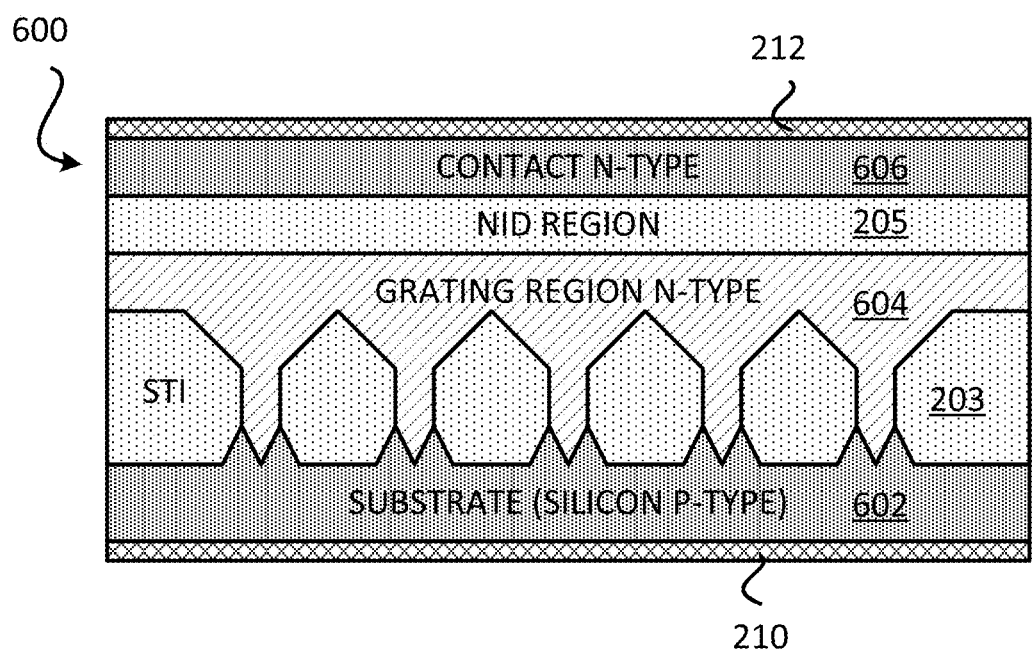
FIG. 6 illustrates a view of an exemplary distributed feedback (DFB) laser comprising a substrate that includes silicon.

FIGS. 5 and 6 illustrate profile views of DFB lasers implemented with different configurations of materials.

FIG. 5 illustrates a DFB laser 500 that includes a substrate 502, the plurality of STIs 203, a grating region 504, the NID region 205, a contact region 506, the first metal layer 210 and the second metal layer 212. The DFB laser 500 may be similar to the DFB laser 200. The substrate 502 may include silicon (Si). The substrate 502 may be similar to the substrate 202. The substrate 502 may include a N type dopant. The substrate 502 may include a N type silicon. The plurality of STIs 203 is coupled to the substrate 502 such that the plurality of STIs 203 is located over a second surface of the substrate 502. The grating region 504 is coupled to the plurality of STIs 203 such that the grating region 504 is located over the plurality of STIs 203. The grating region 504 may be similar to the grating region 204. Portions of the grating region 504 may be coupled to and located over the substrate 502. The grating region 504 may include a P type dopant. The grating region 504 may include one or more III-V semiconductor materials.

The NID region 205 is coupled to the grating region 504 such that the NID region 205 is located over the grating region 504. In some implementations, the NID region 205 may include the grating region 504. Thus, in some implementations, the grating region 504 may be considered part of the NID region 205. The contact region 506 is coupled to the NID region 205 such that the contact region 506 is located over the NID region 205. The contact region 506 may be similar to the contact region 206. The contact region 506 may include a P type dopant. The contact region 506 may include one or more III-V semiconductor materials. The first metal layer 210 is coupled to the first surface of the substrate 502. The second metal layer 212 is coupled to the contact region 506.

It is noted that DFB laser 500 may include one or more voids (e.g., 401) between the plurality of STIs 203 and the grating region 504, as described in FIG. 4.

FIG. 6 illustrates a DFB laser 600 that includes a substrate 602, the plurality of STIs 203, a grating region 604, the NID region 205, a contact region 606, the first metal layer 210 and the second metal layer 212. The DFB laser 600 may be similar to the DFB laser 200. The substrate 602 may include silicon (Si). The substrate 602 may be similar to the substrate 202. The substrate 602 may include a P type dopant. The substrate 602 may include a P type silicon. The plurality of STIs 203 is coupled to the substrate 602 such that the plurality of STIs 203 is located over a second surface of the substrate 602. The grating region 604 is coupled to the plurality of STIs 203 such that the grating region 604 is located over the plurality of STIs 203. The grating region 604 may be similar to the grating region 204. Portions of the grating region 604 may be coupled to and located over the substrate 602. The grating region 604 may include a N type dopant. The grating region 6504 may include one or more III-V semiconductor materials.

The NID region 205 is coupled to the grating region 604 such that the NID region 205 is located over the grating region 604. In some implementations, the NID region 205 may include the grating region 604. Thus, in some implementations, the grating region 604 may be considered part of the NID region 205. The contact region 606 is coupled to the NID region 205 such that the contact region 606 is located over the NID region 205. The contact region 606 may be similar to the contact region 206. The contact region 606 may include a N type dopant. The contact region 606 may include one or more III-V semiconductor materials. The first metal layer 210 is coupled to the first surface of the substrate 602. The second metal layer 212 is coupled to the contact region 606.

It is noted that DFB laser 600 may include one or more voids (e.g., 401) between the plurality of STIs 203 and the grating region 604, as described in FIG. 4.

Exemplary Distributed Feedback Laser Having a Substrate Comprising Silicon

Figure 7:
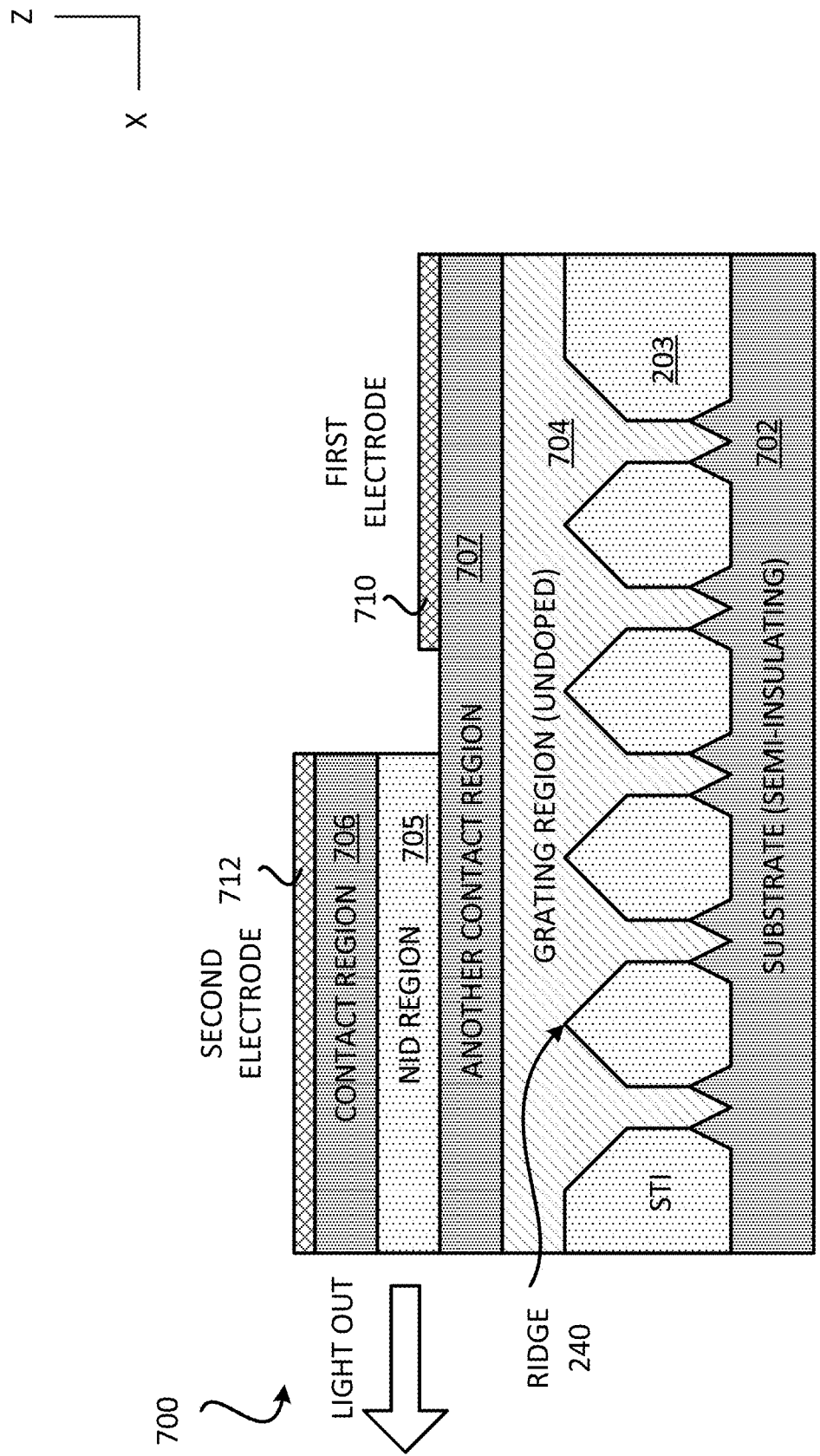
FIG. 7 illustrates a view of another exemplary distributed feedback (DFB) laser comprising a substrate that includes silicon.

FIG. 7 illustrates an example of a distributed feedback (DFB) laser 700 that includes a substrate having silicon. The DFB laser 700 includes a substrate 702, a plurality of shallow trench isolations (STIs) 203, a grating region 704, an non-intentional doping (NID) region 705, a first contact region 707, a second contact region 706, a first metal layer 710 and a second metal layer 712.

The substrate 702 may include silicon (Si). The substrate 702 may be similar to the substrate 202. The substrate 702 may be a semi-insulating substrate. In some implementations, a semi-insulating substrate includes a substrate that has a resistivity equal or greater than $1 \times 10^7$ Ohm-cm. The resistivity described for the substrate 702 may be applicable to any of the substrates described in the disclose. The plurality of STIs 203 is coupled to the substrate 702 such that the plurality of STIs 203 is located over a second surface of the substrate 702. The grating region 704 is coupled to the plurality of STIs 203 such that the grating region 704 is located over the plurality of STIs 203. The grating region 704 may be similar to the grating region 204. Portions of the grating region 704 may be coupled to and located over the substrate 702. The grating region 704 may be undoped. The grating region 704 may include one or more III-V semiconductor materials. The grating region 704 may include means for optical feedback. The grating region 704 may include a means for refractive grating. The grating region 704 may include means for interference grating. In some implementations, refractive grating is an example of optical feedback. In some implementations, interference grating is an example of refractive grating.

The first contact region 707 is coupled to the grating region 704 such that the first contact region 707 is located over the grating region 704. The first contact region 707 may include one or more III-V semiconductor materials. The first contact region 707 may include a N type dopant or a P type dopant.

The NID region 705 is coupled to the first contact region 707 such that the NID region 705 is located over the first contact region 707. In some implementations, the NID region 705 may include the first contact region 707 and/or the grating region 704. Thus, in some implementations, the first contact region 707 and/or the grating region 704 may be considered part of the NID region 705.

The NID region 705 is configured to emit a light from the photons that are generated in the DFB laser 700. When a voltage is applied between the first metal layer 710 and the second metal layer 712, photons may be generated between the grating region 704, the first contact region 707, the NID region 705 and/or the second contact region 706. The photons may reflect and/or refract in the NID region 705, the grating region 704., the first contact region 707 and/or the second contact region 706.

The NID region 705 includes one or more III-V semiconductor materials. Examples of III-V semiconductor materials include Gallium Arsenide (GaAs), Aluminum Gallium Arsenide (AlGaAs), Indium Phosphide (InP). The NID region 705 may include a quantum well (QW) structure and/or a quantum dot (QD) structure. The NID region 705 may include one or more layers of the III-V semiconductor material(s), one more of the QW structures and/or one or more of the QD structures. That is, in some implementations, the NID region 705 may be defined by one or more layers of the III-V semiconductor material(s), one more of the QW structures and/or one or more of the QD structures. The NID region 275 may be formed over the first contact region 707 through an epitaxial growth process (e.g., epi process).

The second contact region 706 is coupled to the NID region 705 such that the second contact region 706 is located over the NID region 705. The second contact region 706 may be similar to the contact region 206. The second contact region 706 may include one or more III-V semiconductor materials. The second contact region 706 may include a N type dopant or a P type dopant.

The first metal layer 710 is coupled to the first contact region 707 such that the first metal layer 710 is located over the first contact region 707. The second metal layer 712 is coupled to the second contact region 706 such that the second metal layer 712 is located over the second contact region 706. The first metal layer 710 and the second metal layer 712 may be located on the same side of the DFB laser 700. The first metal layer 710 and the second metal layer 712 may located on a side opposite to the substrate 702.

As shown in FIG. 7, the DFB laser 700 is configured such that light emits from the NID region 705 in a certain direction. It is noted that the DFB laser 700 may be configured in such a way that light may emit from the NID region 705 in a different direction and/or a different angle. In some implementations, light may emit from other components (e.g., grating region 704, second contact region 706, first contact region 707) of the DFB laser 700. The properties (e.g., wavelength) of the light that is emitted may vary based on the materials, shapes, dimensions and/or configurations that are used in the DFB laser 700.

Figure 8:
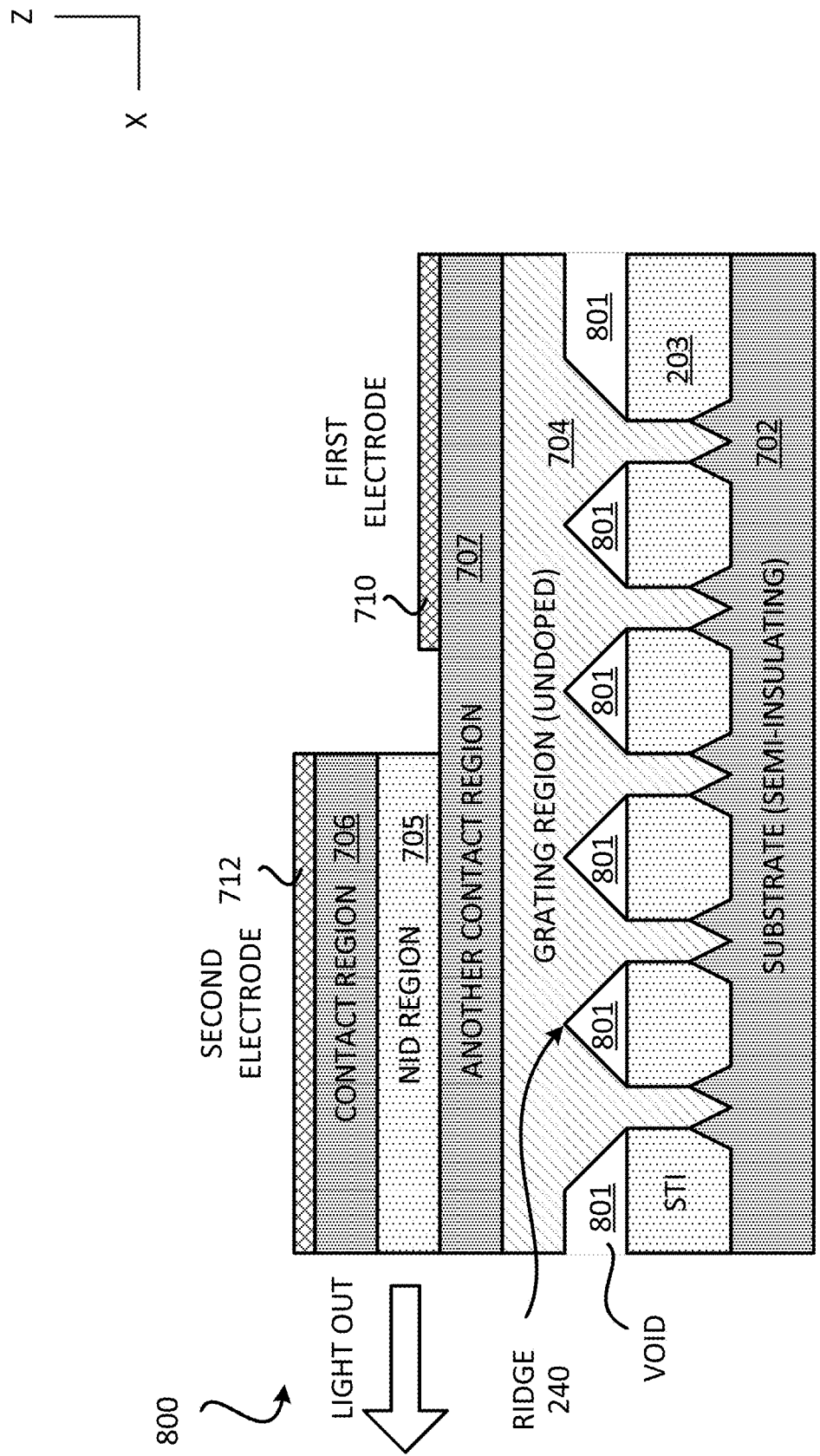
FIG. 8 illustrates a view of an exemplary distributed feedback (DFB) laser comprising a void and a substrate that includes silicon.

FIG. 8 illustrates a profile view of a DFB laser 800. The DFB laser 800 is similar to the DFB laser 700 of FIG. 7. The DFB laser 800 may include the same or similar components as the DFB laser 700, and may operate the same or in a similar manner as the DFB laser 700. As shown in FIG. 7, the DFB laser 700 includes the substrate 702, the plurality of STIs 203, a plurality of voids 801, the grating region 704, the first contact region 707, the NID region 705, the second contact region 706, the first metal layer 710 and the second metal layer 712.

The plurality of voids 801 may be a space that is free of a solid material. The plurality of voids 701 may be located over the plurality of STIs 203. The plurality of voids 801 may be located between the plurality of STIs 203 and the grating region 704. The plurality of voids 801 may represent several voids or one continuous void. In some implementations, the plurality of voids 801 may help the grating region 704 provide improved refraction. In some implementations, the plurality of voids 801 may be an artifact of the fabrication process used to fabricate the DFB laser 800. Different implementations may have voids with different shapes and/or sizes.

Figure 9:
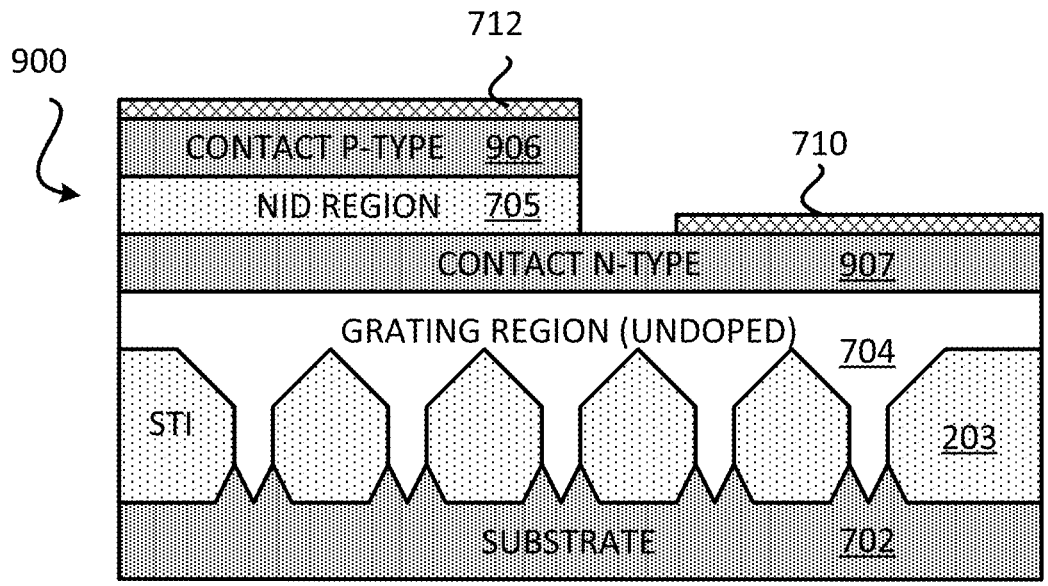
FIG. 9 illustrates a view of an exemplary distributed feedback (DFB) laser comprising a substrate that includes silicon.
Figure 10:
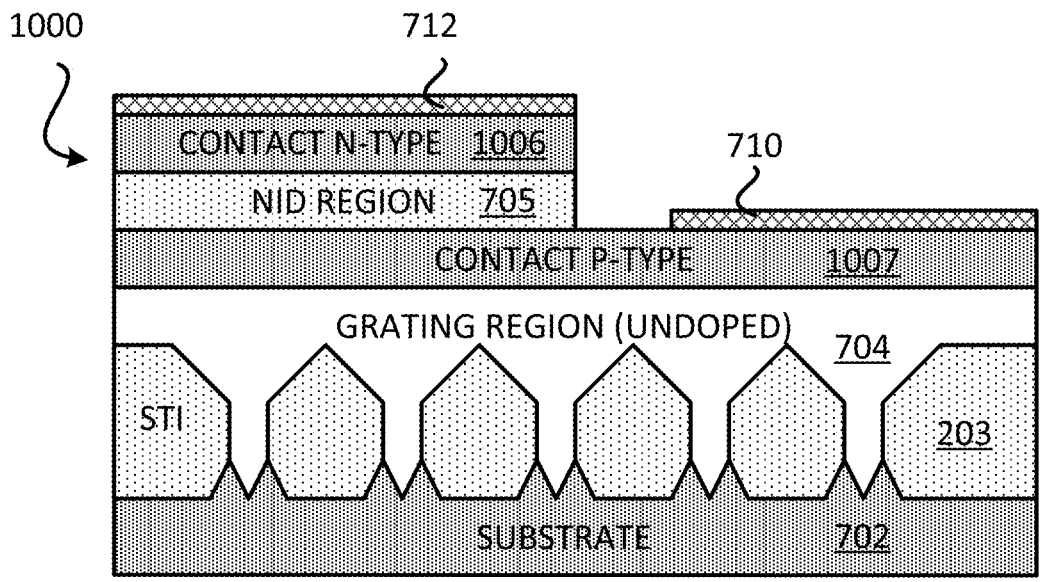
FIG. 10 illustrates a view of an exemplary distributed feedback (DFB) laser comprising a substrate that includes silicon.

FIGS. 9 and 10 illustrate profile views of DFB lasers implemented with different configurations of materials.

FIG. 9 illustrates a DFB laser 900 that includes a substrate 702, the plurality of STIs 203, the grating region 704, a first contact region 907, the NID region 705, a second contact region 906, the first metal layer 710 and the second metal layer 712. The DFB laser 900 may be similar to the DFB laser 700. The substrate 702 may include silicon (Si). The substrate 702 may be a semi-insulating substrate. The plurality of STIs 203 is coupled to the substrate 702 such that the plurality of STIs 203 is located over the substrate 702. The grating region 704 is coupled to the plurality of STIs 203 such that the grating region 704 is located over the plurality of STIs 203. Portions of the grating region 704 may be coupled to and located over the substrate 702. The grating region 704 may be undoped. The grating region 704 may include one or more III-V semiconductor materials.

The first contact region 907 is coupled to the grating region 704 such that the first contact region is located over the grating region 704. The first contact region 907 is similar to the first contact region 707. The first contact region 907 may include one or more III-V semiconductor materials. The first contact region 907 may include a N type dopant. The first metal layer 710 is coupled to the first contact region 907 such that the first metal layer 710 is located over the first contact region 907.

The NID region 705 is coupled to the first contact region 907 such that the NID region 705 is located over the first contact region 907. In some implementations, the NID region 705 may include first contact region 907 and/or the grating region 704. Thus, in some implementations, the first contact region 907 and/or the grating region 704 may be considered part of the NID region 705. The second contact region 906 is coupled to the NID region 705 such that the second contact region 906 is located over the NID region 705. The second contact region 906 may be similar to the contact region 706. The second contact region 906 may include a P type dopant. The second contact region 906 may include one or more III-V semiconductor materials. The second metal layer 712 is coupled to the second contact region 906.

It is noted that DFB laser 900 may include one or more voids (e.g., 801) between the plurality of STIs 203 and the grating region 704, as described in FIG. 8.

FIG. 10 illustrates a DFB laser 1000 that includes a substrate 702, the plurality of STIs 203, the grating region 704, a first contact region 1007, the NID region 705, a second contact region 1006, the first metal layer 710 and the second metal layer 712. The DFB laser 1000 may be similar to the DFB laser 700. The substrate 702 may include silicon (Si). The substrate 702 may be a semi-insulating substrate. The plurality of STIs 203 is coupled to the substrate 702 such that the plurality of STIs 203 is located over the substrate 702. The grating region 704 is coupled to the plurality of STIs 203 such that the grating region 704 is located over the plurality of STIs 203. Portions of the grating region 704 may be coupled to and located over the substrate 702. The grating region 704 may be undoped. The grating region 704 may include one or more III-V semiconductor materials.

The first contact region 1007 is coupled to the grating region 704 such that the first contact region is located over the grating region 704. The first contact region 1007 is similar to the first contact region 707. The first contact region 1007 may include one or more III-V semiconductor materials. The first contact region 1007 may include a P type dopant. The first metal layer 710 is coupled to the first contact region 1007 such that the first metal layer 710 is located over the first contact region 1007.

The NID region 705 is coupled to the first contact region 1007 such that the NID region 705 is located over the first contact region 1007. In some implementations, the NID region 705 may include first contact region 1007 and/or the grating region 704. Thus, in some implementations, the first contact region 1007 and/or the grating region 704 may be considered part of the NID region 705. The second contact region 1006 is coupled to the NID region 705 such that the second contact region 1006 is located over the NID region 705. The second contact region 1006 may be similar to the contact region 706. The second contact region 1006 may include a N type dopant. The second contact region 1006 may include one or more III-V semiconductor materials. The second metal layer 712 is coupled to the second contact region 1006.

It is noted that DFB laser 1000 may include one or more voids (e.g., 801) between the plurality of STIs 203 and the grating region 704, as described in FIG. 8.

Figure 11:
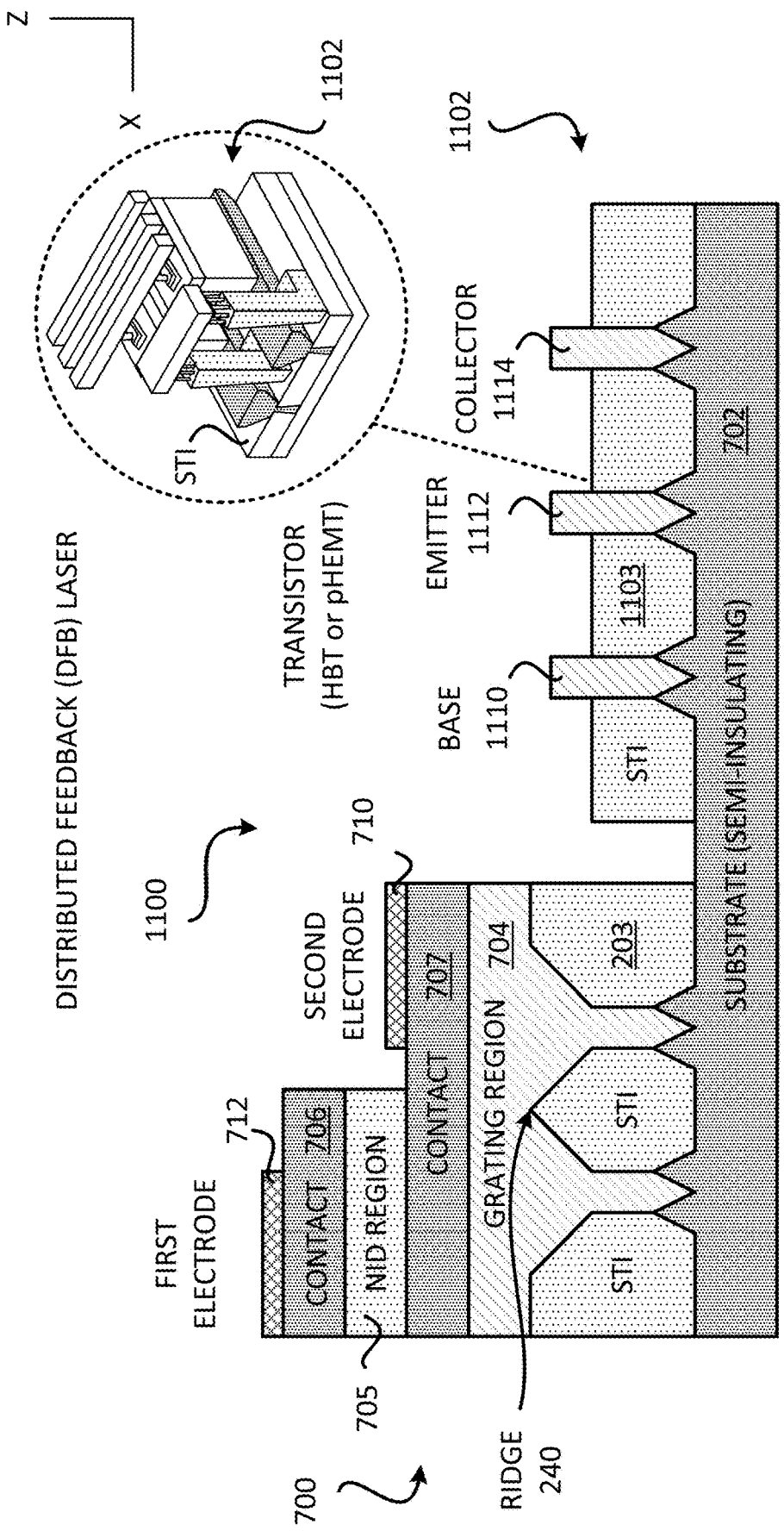
FIG. 11 illustrates a view of an exemplary distributed feedback (DFB) laser implemented next to a transistor, in an integrated device.

Exemplary Device Comprising a Transistor Next to a Distributed Feedback Laser Having a Substrate Comprising Silicon FIG. 11 illustrates an example of a device that includes a transistor next to a distributed feedback (DFB) laser that includes a substrate having silicon. In particular, FIG. 11 illustrates a device 1100 that includes the DFB laser 700 and a transistor 1102. The device 1100 may include an integrated device.

The DFB laser 700 includes the substrate 702, the plurality of shallow trench isolations (STIs) 203, the grating region 704, the NID region 705, the first contact region 707, the second contact region 706, the first metal layer 710 and the second metal layer 712.

The transistor 1102 is located over the substrate 702. The transistor 1102 may be a heterojunction bipolar transistor (HBT) or a high electron mobility transistor (HEMT) (e.g., pseudomorphic HEMT). The transistor 1102 includes a base 1110, an emitter 1112 and a collector 1114. The shapes and/or locations of the base 1110, the emitter 1112 and/or the collector 1114 may vary with different implementations. The transistor 1102 may include other components. FIG. 11 also illustrates an angled view of at least a portion of the transistor 1102. A person of ordinary skill in the art will appreciate that the transistor 1102 may include other components other than the base 1110, the emitter 1112 and/or the collector 1114, and the STIs 1103. These other components are not described, but a person of ordinary skill in the art would appreciate and know what these components are. For example, the transistor 1102 may include a base contact, an emitter contact and/or a collector contact. As will be further described below, the transistor 1102 may be coupled to metal layers (e.g., M1, M2) of an integrated device. The transistor 1102 may be part of the same circuit as the DFB laser 700. In some implementations, the transistor 1102 may be configured to be electrically coupled to DBF laser 700. The transistor 1102 may be configured to help control and/or operate the DFB laser 700.

The transistor 1102 is located next to the DFB laser 700. The transistor 1102 and the DFB laser 700 share the same substrate 702.

Figure 12:
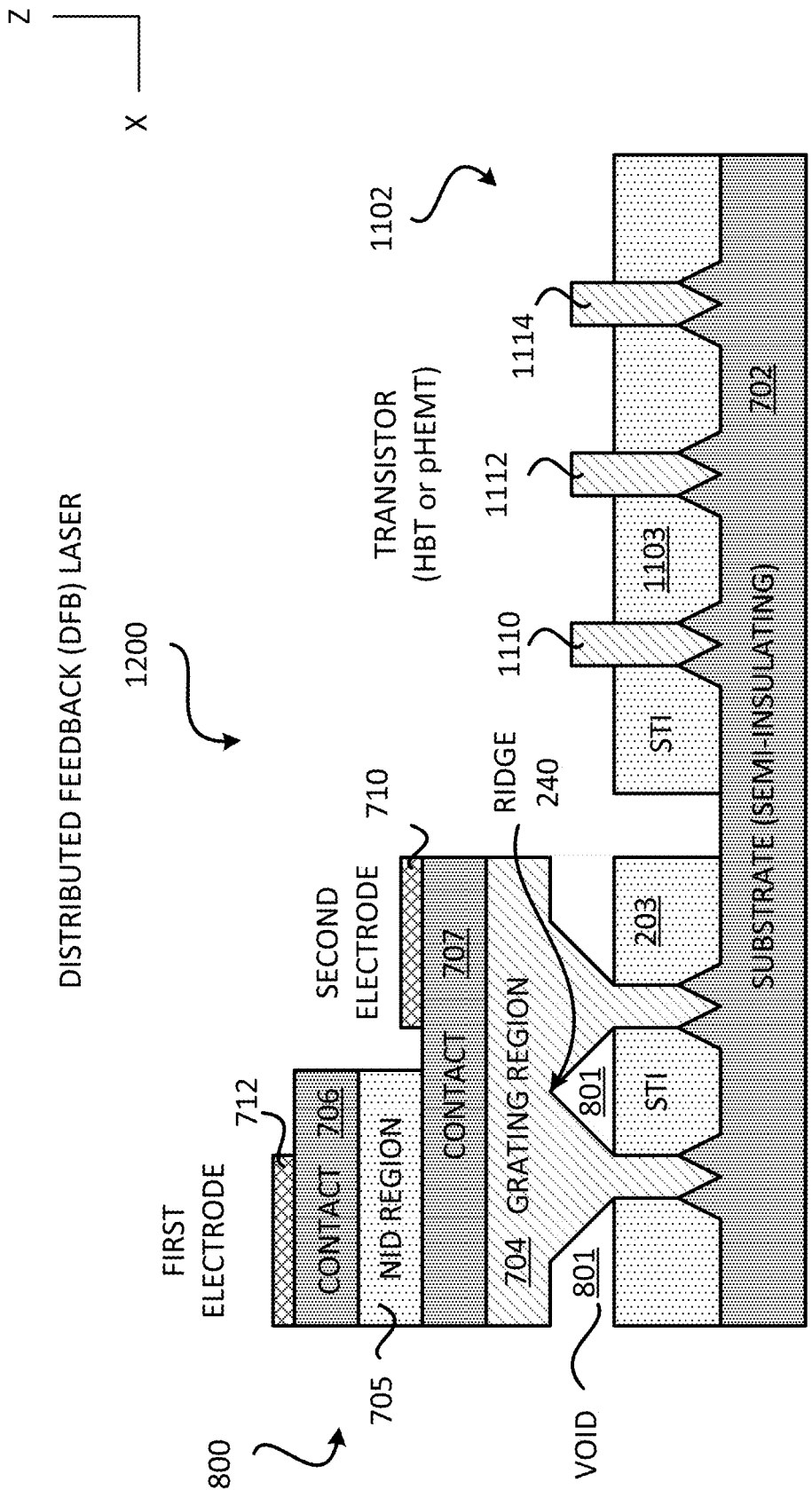
FIG. 12 illustrates a view of an exemplary distributed feedback (DFB) laser implemented next to a transistor, in an integrated device.

FIG. 12 illustrates a device 1200 that includes the DFB laser 800 and the transistor 1102. The device 1200 may include an integrated device. The device 1200 may be similar to the device 1100. The device 1200 includes a DFB laser that includes voids.

The DFB laser 800 includes the substrate 702, the plurality of shallow trench isolations (STIs) 203, the plurality of voids 801, the grating region 704, the NID region 705, the first contact region 707, the second contact region 706, the first metal layer 710 and the second metal layer 712. The transistor 1102 is located next to the DFB laser 800. The transistor 1102 and the DFB laser 800 share the same substrate 702.

Figure 13:
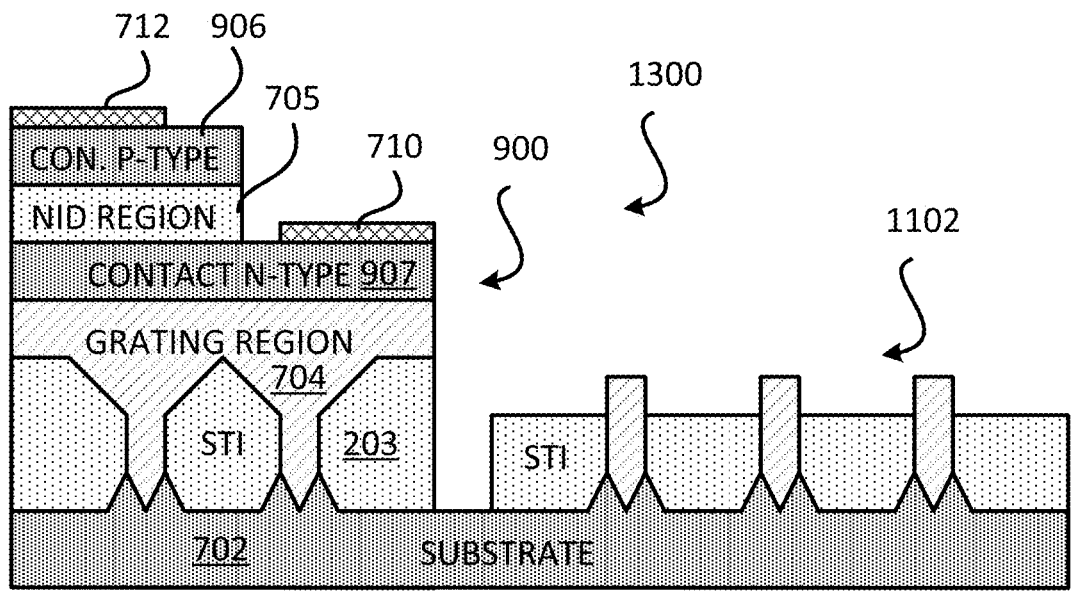
FIG. 13 illustrates a view of an exemplary distributed feedback (DFB) laser implemented next to a transistor, in an integrated device.

FIG. 13 illustrates a device 1300 that includes the DFB laser 900 and the transistor 1102. The device 1300 may include an integrated device. The device 1300 may be similar to the device 1100. The DFB laser 900 includes the substrate 702, the plurality of shallow trench isolations (STIs) 203, the grating region 704, the NID region 705, the first contact region 907, the second contact region 906, the first metal layer 710 and the second metal layer 712. The first contact region 907 includes a N type dopant. The second contact region 906 includes a P type dopant. The transistor 1102 is located next to the DFB laser 900. The transistor 1102 and the DFB laser 900 share the same substrate 702. The DFB laser 900 may include the plurality of voids 801 as described in FIG. 8.

Figure 14:
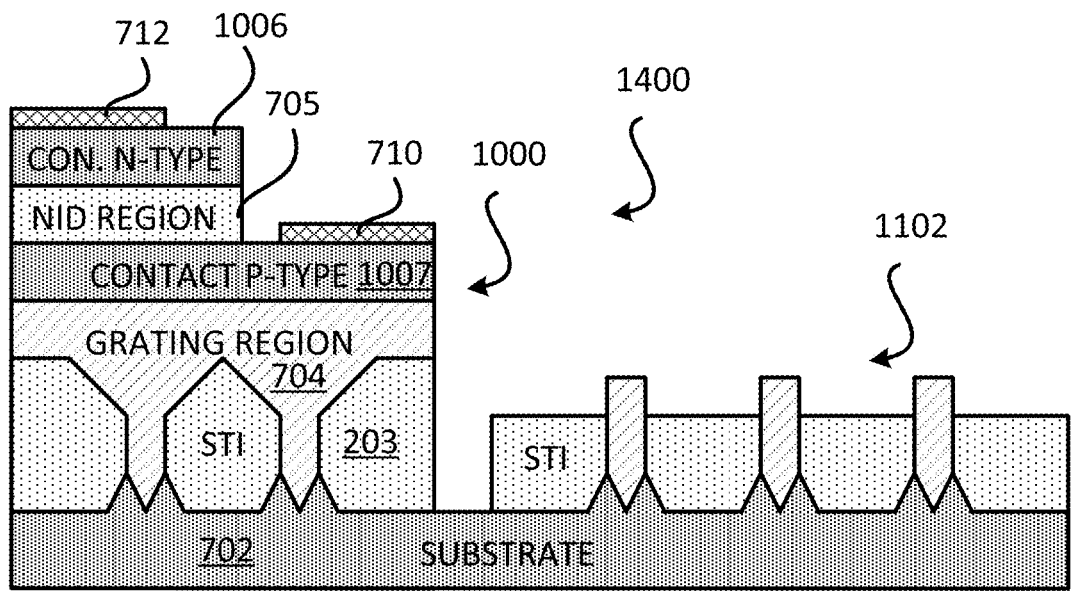
FIG. 14 illustrates a view of an exemplary distributed feedback (DFB) laser implemented next to a transistor, in an integrated device.

FIG. 14 illustrates a device 1400 that includes the DFB laser 1000 and the transistor 1102. The device 1400 may include an integrated device. The device 1400 may be similar to the device 1100. The DFB laser 1000 includes the substrate 702, the plurality of shallow trench isolations (STIs) 203, the grating region 704, the NID region 705, the first contact region 1007, the second contact region 1006, the first metal layer 710 and the second metal layer 712. The first contact region 1007 includes a P type dopant. The second contact region 1006 includes a N type dopant. The transistor 1102 is located next to the DFB laser 1000. The transistor 1102 and the DFB laser 1000 share the same substrate 702. The DFB laser 1000 may include the plurality of voids 801 as described in FIG. 8.

Having described various distributed feedback lasers on a substrate comprising silicon (Si), a sequence for fabricating a distributed feedback laser will now be described below.

Exemplary Sequence for Fabricating a Distributed Feedback (DFB) Laser on a Substrate Comprising Silicon In some implementations, fabricating a distributed feedback (DFB) laser on a substrate comprising silicon includes several processes. FIG. 15 (which includes FIGS. 15A-15D) illustrates an exemplary sequence for providing or fabricating a DFB laser. In some implementations, the sequence of FIGS. 15A-15D may be used to provide or fabricate the DFB laser of FIGS. 2-6 and/or other DFB lasers described in the present disclosure. In addition, the sequence for fabricating the DFB laser may be used to fabricate several DFB lasers at the same time. However, for the purpose of clarity, the sequence of FIG. 15 illustrates the fabrication of one DFB laser.

It should be noted that the sequence of FIGS. 15A-15D may combine one or more stages in order to simplify and/or clarify the sequence for providing or fabricating a DFB laser. In some implementations, the order of the processes may be changed or modified. In some implementations, one or more of processes may be replaced or substituted without departing from the spirit of the disclosure.

Figure 15A:
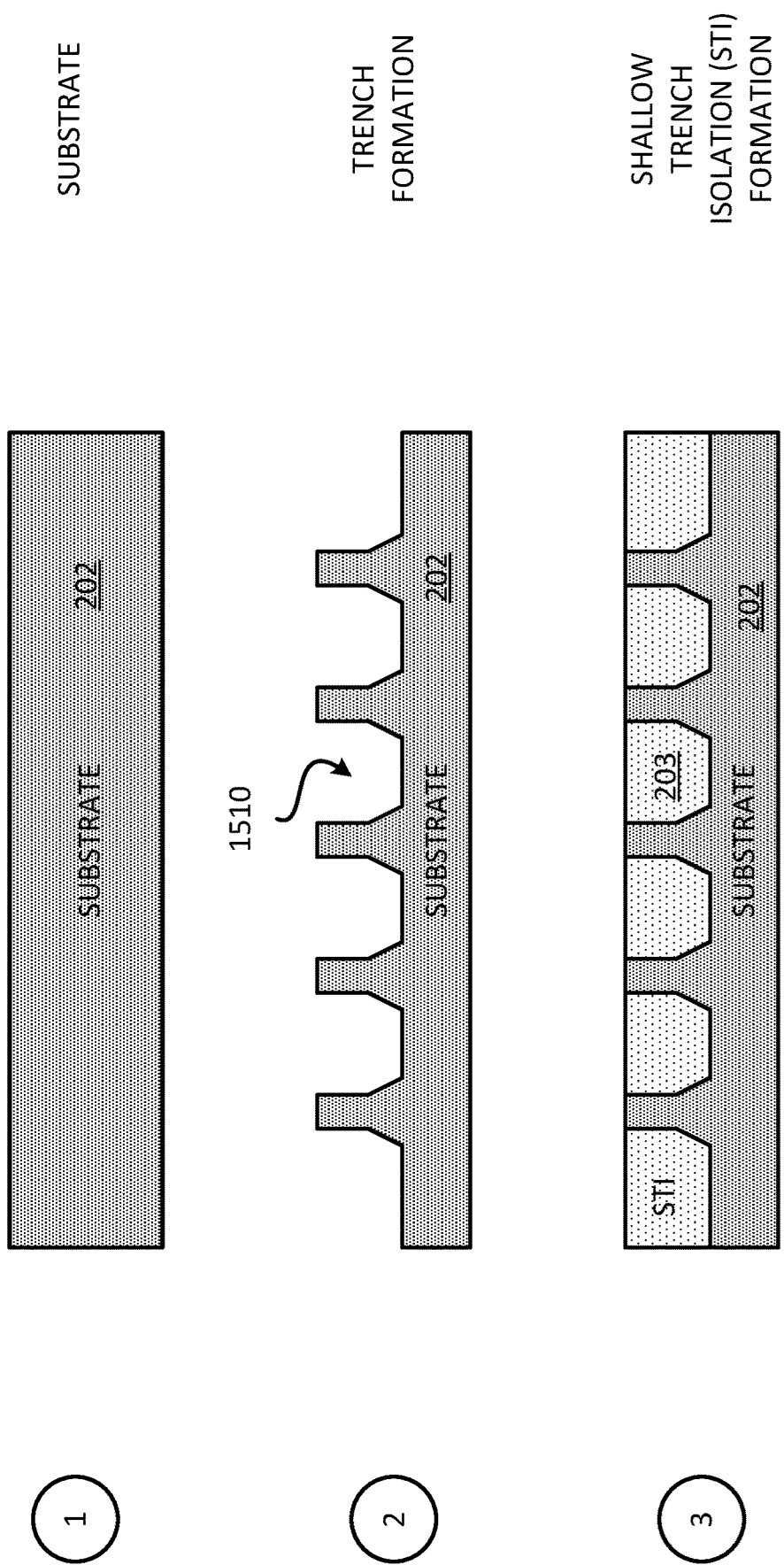
FIG. 15 (comprising FIGS. 15A-15D) illustrates an exemplary sequence for fabricating a distributed feedback (DFB) laser comprising a substrate that includes silicon.

Stage 1, as shown in FIG. 15A, illustrates a state after a substrate 202 is provided. Different implementations may provide different materials for the substrate 202. In some implementations, the substrate 202 may include silicon (Si). In some implementations, the substrate 202 may already include dopant. In some implementations, the substrate 202 may be doped with a P type dopant or a N type dopant.

Stage 2 illustrates a state after trenches 1510 are formed in the substrate 202. Trench formation may include a stack deposition (e.g., oxide, nitride, resist deposition) process, a lithography process, and/or a dry etching process.

Stage 3 illustrates a state after a plurality of shallow trench isolations (STIs) 203 is formed. STI formation may include a trench fill oxidation process, a polishing process (e.g., chemical mechanical polishing (CMP) of oxide) and/or removal of protective layer process. The plurality of STIs 203 may be formed in the trenches 1510.

Figure 15B:
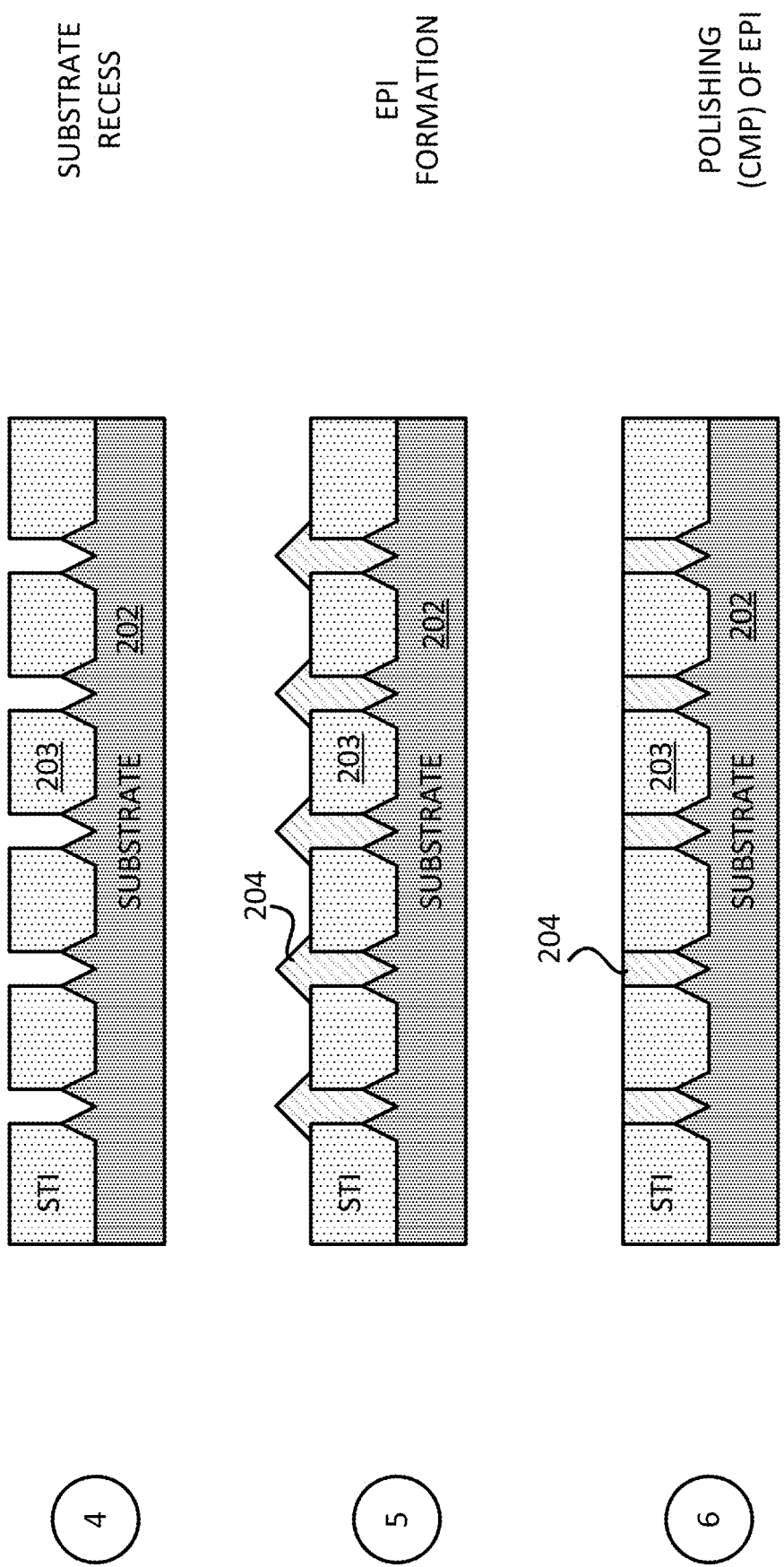

Stage 4, as shown in FIG. 15B, illustrates a state after portions of the substrate 202 are removed. In some implementations, portions of the substrate 202 that are located between (e.g., laterally between) the plurality of STIs 203 are removed. A stack deposition (e.g., oxide, nitride, resist deposition) process, a lithography process, and/or a dry etching process may be used to remove portions of the substrate 202.

Stage 5 illustrates a state after portions of the grating region 204 are formed. An epitaxial process may be used to form the grating region 204 between the plurality of STIs 203 and over the plurality of STIs 203.

Stage 6 illustrates a state after portions of the grating region 204 are removed. A polishing process (e.g., CMP process) may be used to remove portions of the grating region 204 that are located over the plurality of STIs 203.

Figure 15C:
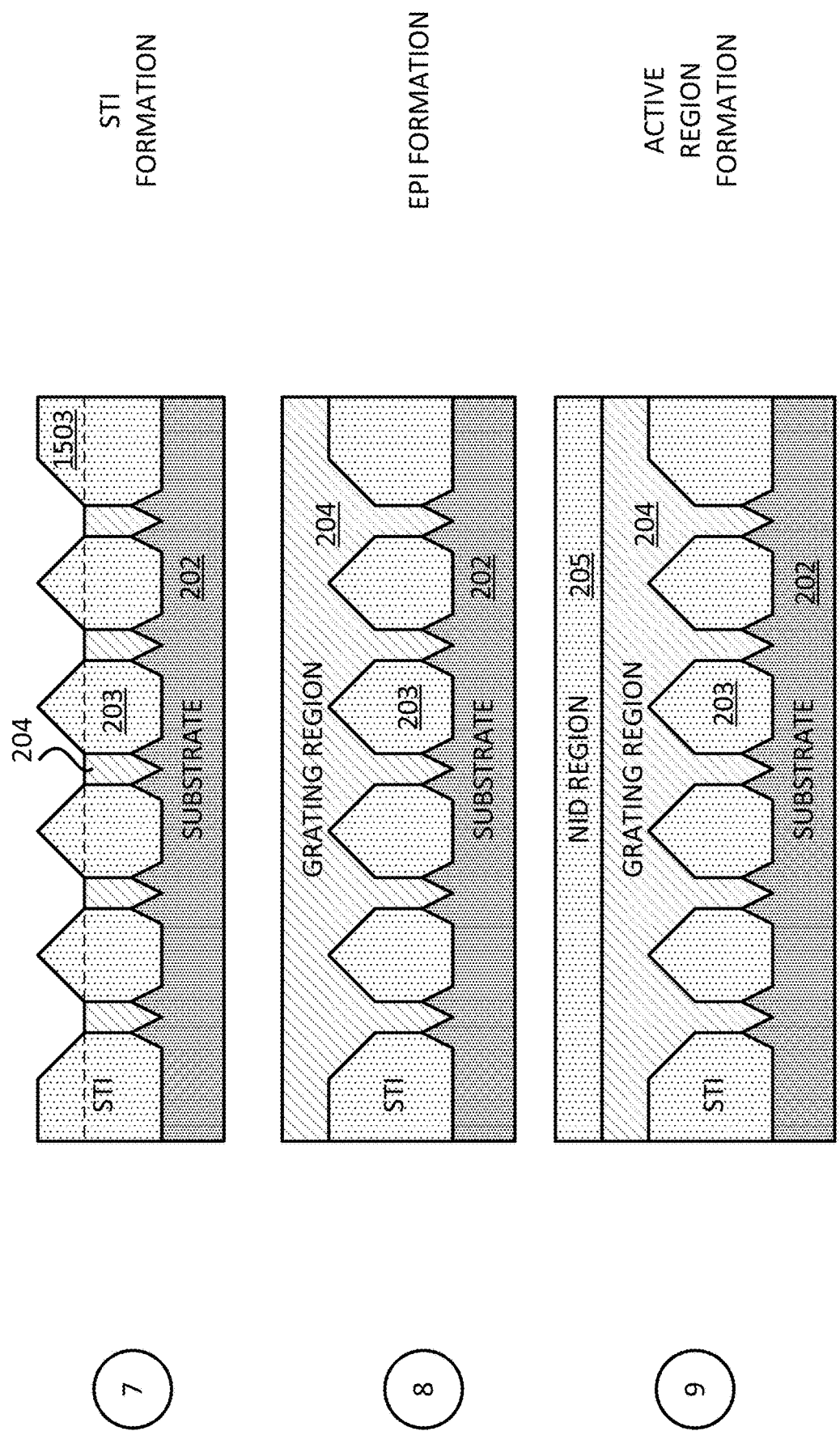

Stage 7, as shown in FIG. 15C, illustrates a state after additional layers of the STIs 1503 are formed over the already formed STIs 203. There may or may not be a boundary between the STIs 203 that is already formed and the newly formed STIs 1503. For the purpose of simplification, the STIs 203 may include the STIs 1503. STI formation may include a trench fill oxidation process, a polishing process (e.g., chemical mechanical polishing (CMP) of oxide) and/or removal of protective layer process.

Stage 8 illustrates a state after an additional grating region 204 is formed over the STI 203. An epitaxial process may be used to form the additional grating region 204. The grating region 204 may be undoped or doped. The grating region 204 may include a N type dopant or a P type dopant. The grating region 204 may include one or more III-V semiconductor materials. The grating region 204 may include a repeating pattern of shapes and/or surfaces. For example, the grating region 204 may include a repeating pattern of ridges 240. It is noted that different implementations may use a repeating pattern with different shapes and/or sizes.

Stage 9 illustrates a state after the NID region 205 is formed over the grating region 204. An epitaxial process may be used to form the NID region 205. The NID region 205 may be undoped or doped. The NID region 205 may include a N type dopant or a P type dopant. The NID region 205 may include at least one QW structure or at least one QD structure. The NID region 205 may include one or more III-V semiconductor materials.

Figure 15D:
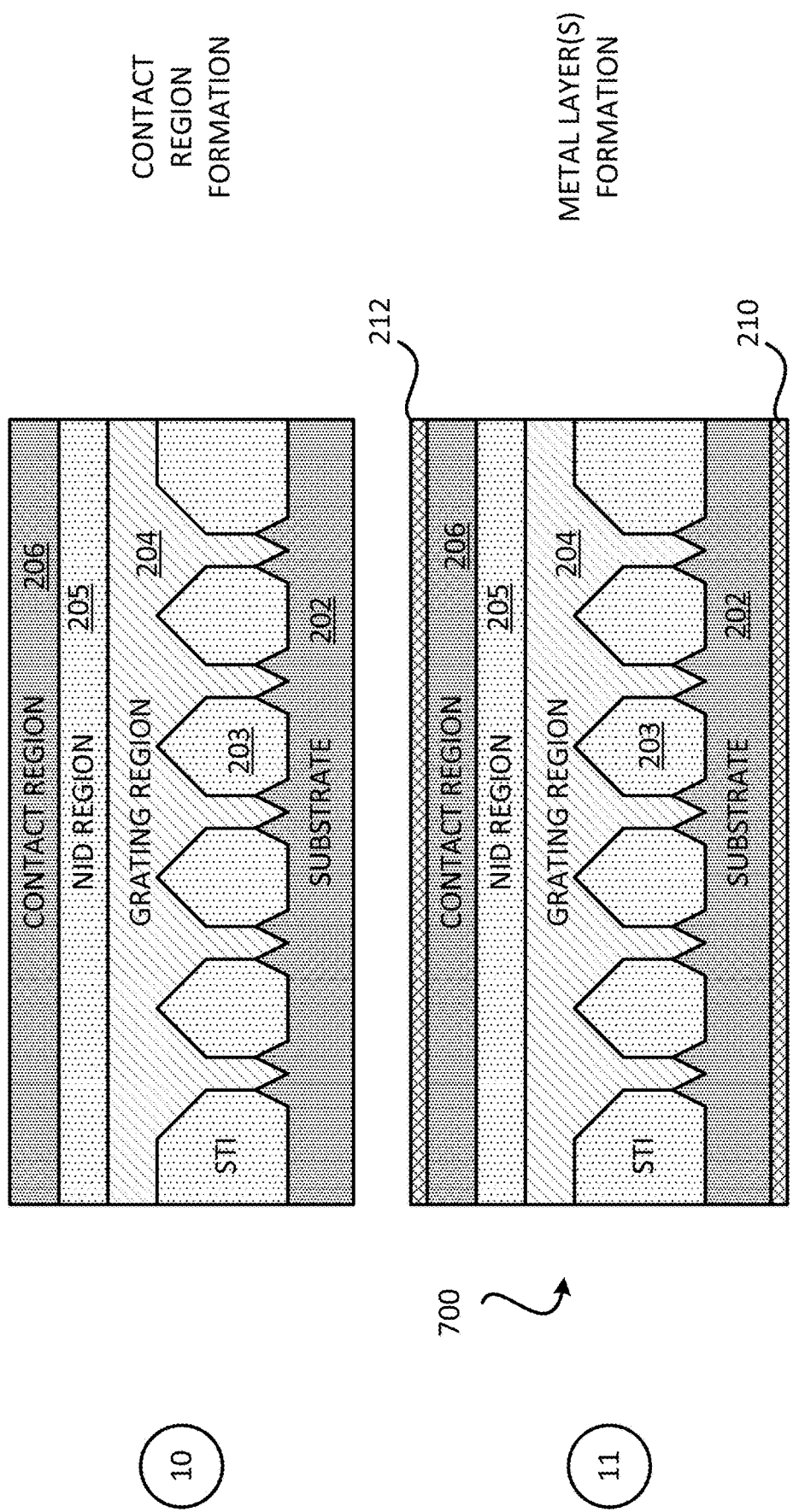

Stage 10, as shown in FIG. 15D, illustrates a state after the contact region 206 is formed over the NID region 205. An epitaxial process may be used to form the contact region 206. The contact region 206 may include a N type dopant or a P type dopant. The contact region 206 may include one or more III-V semiconductor materials.

Stage 11 illustrates a state after the first metal layer 210 and the second metal layer 212 are formed. The first metal layer 210 may be formed over the first surface of the substrate 202 by a plating process. The second metal layer 212 may be formed over the contact region 206 by a plating process. In some implementations, the first metal layer 210 and/or the second metal layer 212 may be formed using a different process, such as sputtering process. Stage 11 may illustrate the DFB laser 200. In some implementations, depending on the dopants that are used on the various regions, Stage 11 may illustrate the DFB laser 500 or the DFB laser 600.

As mentioned above, in some implementations, a DFB laser may include one or more voids. A sequence for fabricating a DFB laser that includes one or more voids will now be described below.

Figure 16A:
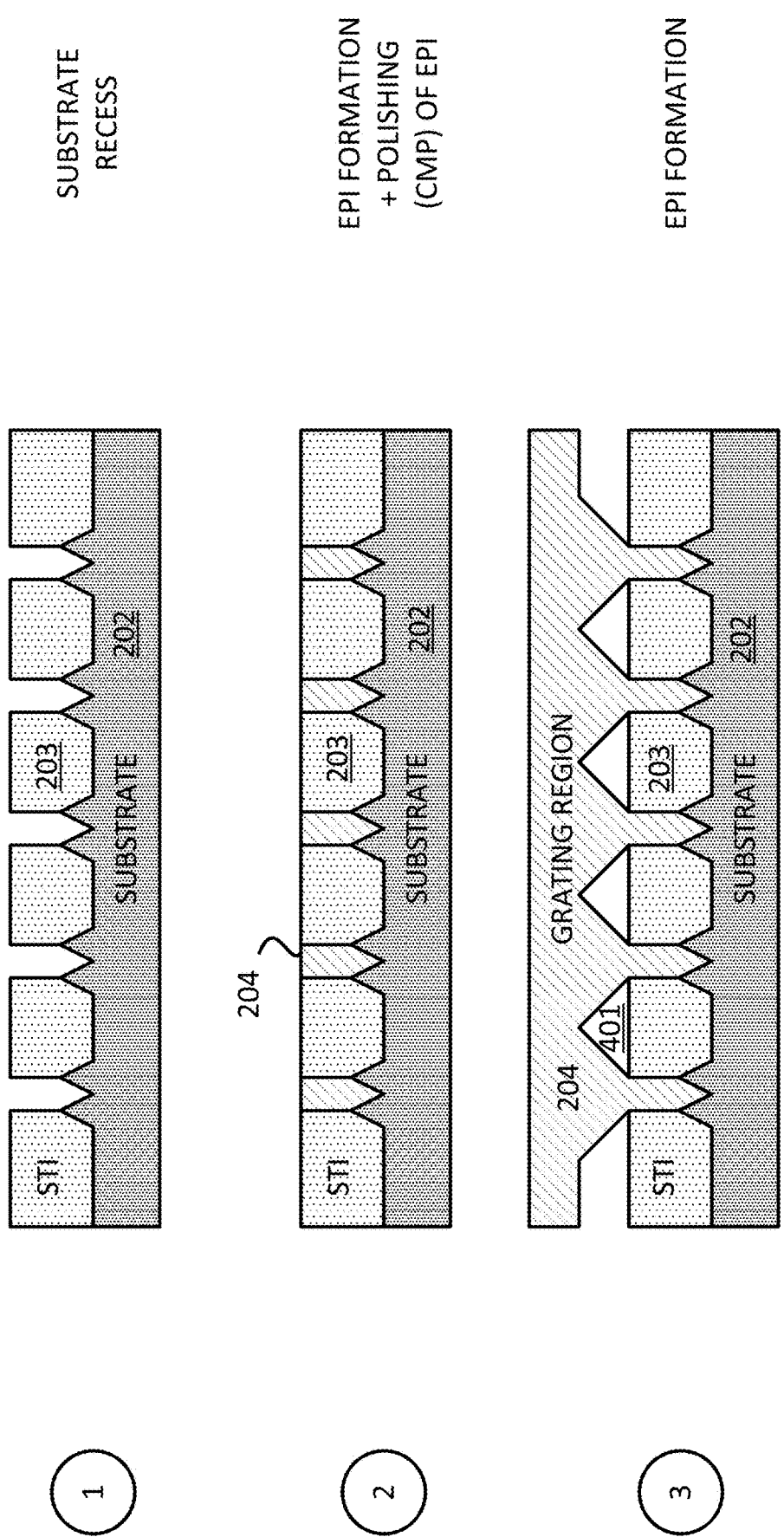
FIG. 16 (comprising FIGS. 16A-16C) illustrates an exemplary sequence for fabricating a distributed feedback (DFB) laser comprising at least one void and a substrate that includes silicon.
Figure 16B:
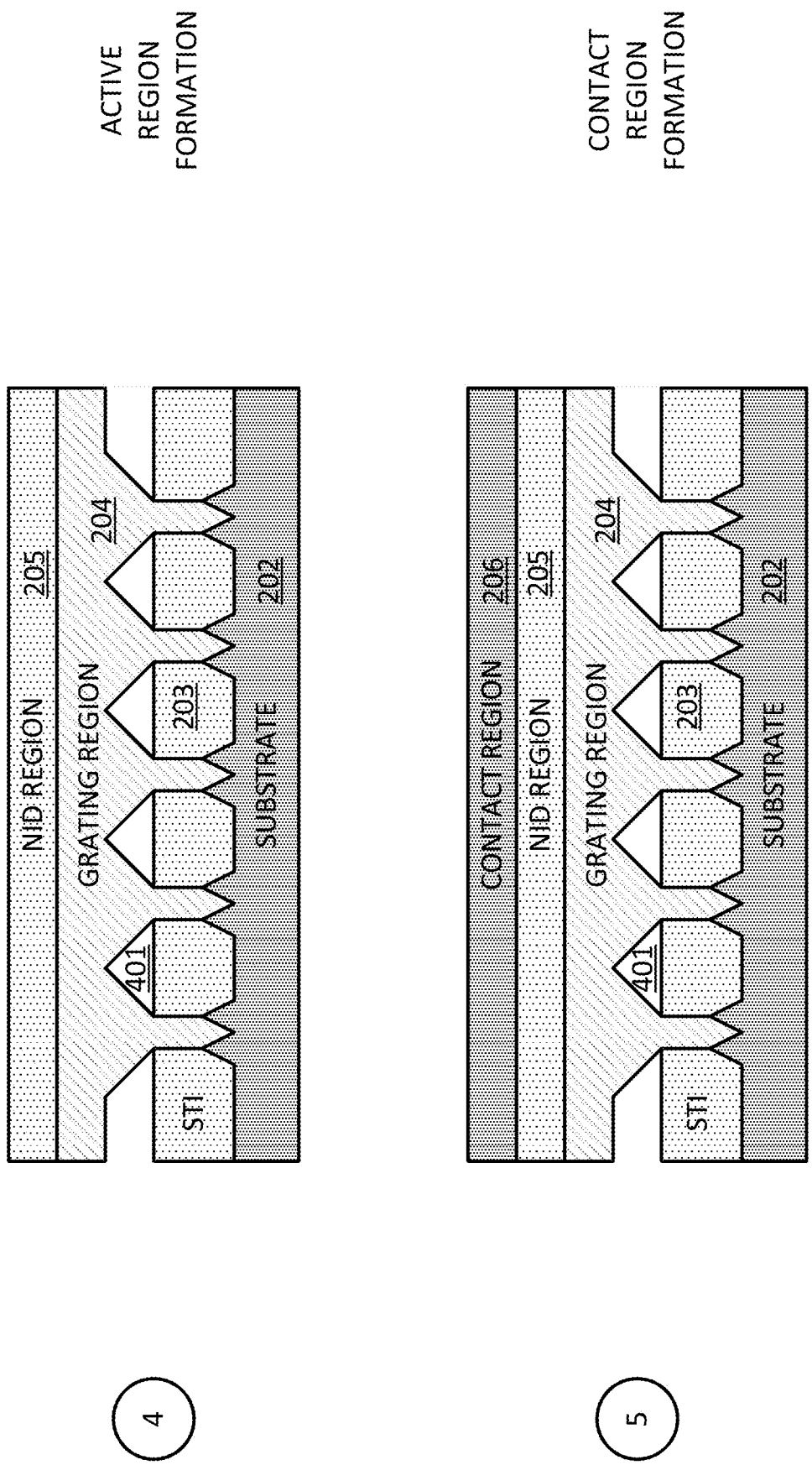
Figure 16C:
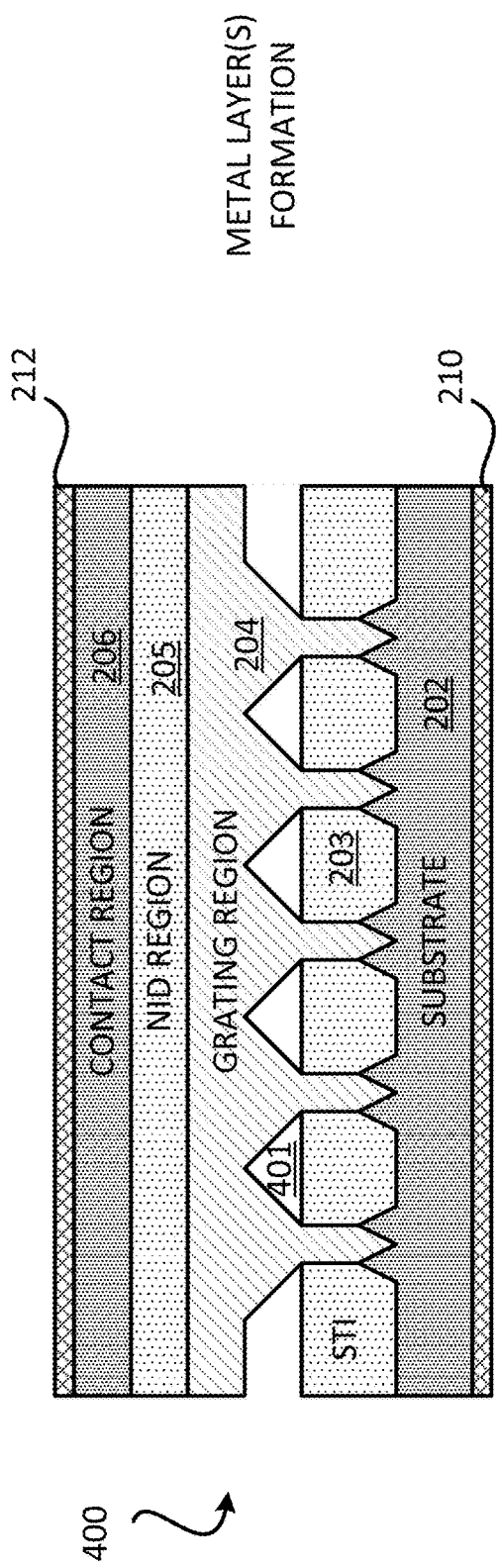

Exemplary Sequence for Fabricating a Distributed Feedback (DFB) Laser Comprising a Void In some implementations, fabricating a distributed feedback (DFB) laser comprising a void includes several processes. FIG. 16 (which includes FIGS. 16A-16C) illustrates an exemplary sequence for providing or fabricating a DFB laser. In some implementations, the sequence of FIGS. 16A-16C may be used to provide or fabricate the DFB laser of FIGS. 2-6 and/or other DFB lasers described in the present disclosure. In addition, the sequence for fabricating the DFB laser may be used to fabricate several DFB lasers at the same time. However, for the purpose of clarity, the sequence of FIG. 16 illustrates the fabrication of one DFB laser.

It should be noted that the sequence of FIGS. 16A-16C may combine one or more stages in order to simplify and/or clarify the sequence for providing or fabricating a DFB laser. In some implementations, the order of the processes may be changed or modified. In some implementations, one or more of processes may be replaced or substituted without departing from the spirit of the disclosure.

Stage 1, as shown in FIG. 16A, illustrates a state after portions of the substrate 202 are removed. In some implementations, portions of the substrate 202 that are located between (e.g., laterally between) the plurality of STIs 203 are removed. A stack deposition (e.g., oxide, nitride, resist deposition) process, a lithography process, and/or a dry etching process may be used to remove portions of the substrate 202. Stage 1 of FIG. 16A may represent a state after Stages 1-4 of FIGS. 15A-15B have been performed. For example, Stage 1 of FIG. 16 may represent a state after a substrate 202 is provided (e.g., doped or undoped substrate) and a plurality of STIs 203 are formed in the substrate 202.

Stage 2 illustrates a state after portions of the grating region 204 are formed. An epitaxial process may be used to form the grating region 204 between the plurality of STIs 203 and over the plurality of STIs 203.

Stage 3 illustrates a state after an additional grating region 204 is formed over the STI 203. The grating region 204 is formed such that one or more voids 801 are created over the plurality of STIs 203. The one or more voids 401 may be located between the plurality of STIs 203 and the grating region 204. An epitaxial process may be used to form the additional grating region 204. The grating region 204 may be undoped or doped. The grating region 204 may include a N type dopant or a P type dopant. The grating region 204 may include one or more III-V semiconductor materials. The grating region 204 may include a repeating pattern of shapes and/or surfaces. For example, the grating region 204 may include a repeating pattern of ridges 240. It is noted that different implementations may use a repeating pattern with different shapes and/or sizes.

Stage 4, as shown in FIG. 16B, illustrates a state after the NID region 205 is formed over the grating region 204. An epitaxial process may be used to form the NID region 205. The NID region 205 may be undoped or doped. The NID region 205 may include a N type dopant or a P type dopant. The NID region 205 may include at least one QW structure or at least one QD structure. The NID region 205 may include one or more III-V semiconductor materials.

Stage 5 illustrates a state after the contact region 206 is formed over the NID region 205. An epitaxial process may be used to form the contact region 206. The contact region 206 may include a N type dopant or a P type dopant. The contact region 206 may include one or more III-V semiconductor materials.

Stage 6, as shown in FIG. 16C, illustrates a state after the first metal layer 210 and the second metal layer 212 are formed. The first metal layer 210 may be formed over the first surface of the substrate 202 by a plating process. The second metal layer 212 may be formed over the contact region 206 by a plating process. In some implementations, the first metal layer 210 and/or the second metal layer 212 may be formed using a different process, such as sputtering process. Stage 11 may illustrate the DFB laser 400. In some implementations, depending on the dopants that are used on the various regions, Stage 6 may illustrate the DFB laser 500 (with voids) or the DFB laser 600 (with voids).

Exemplary Sequence for Fabricating a Transistor and a Distributed Feedback (DFB) Laser on a Substrate Comprising Silicon In some implementations, fabricating a transistor and a distributed feedback (DFB) laser on a substrate comprising silicon includes several processes. FIG. 17 (which includes FIGS. 17A-17D) illustrates an exemplary sequence for providing or fabricating a transistor and a DFB laser on a substrate. In some implementations, the sequence of FIGS. 17A-17D may be used to provide or fabricate transistor and the DFB laser of FIGS. 11-14 and/or other transistors and DFB lasers described in the present disclosure. For example, the sequence of FIGS. 17A-17D may be used to fabricate the DFB lasers (with or without voids) of FIGS. 8-10. In addition, the sequence for fabricating the transistor and the DFB laser may be used to fabricate several transistors and DFB lasers at the same time. However, for the purpose of clarity, the sequence of FIG. 17 illustrates the fabrication of one transistor and one DFB laser.

It should be noted that the sequence of FIGS. 17A-17D may combine one or more stages in order to simplify and/or clarify the sequence for providing or fabricating a transistor and a DFB laser. In some implementations, the order of the processes may be changed or modified. In some implementations, one or more of processes may be replaced or substituted without departing from the spirit of the disclosure.

Figure 17A:
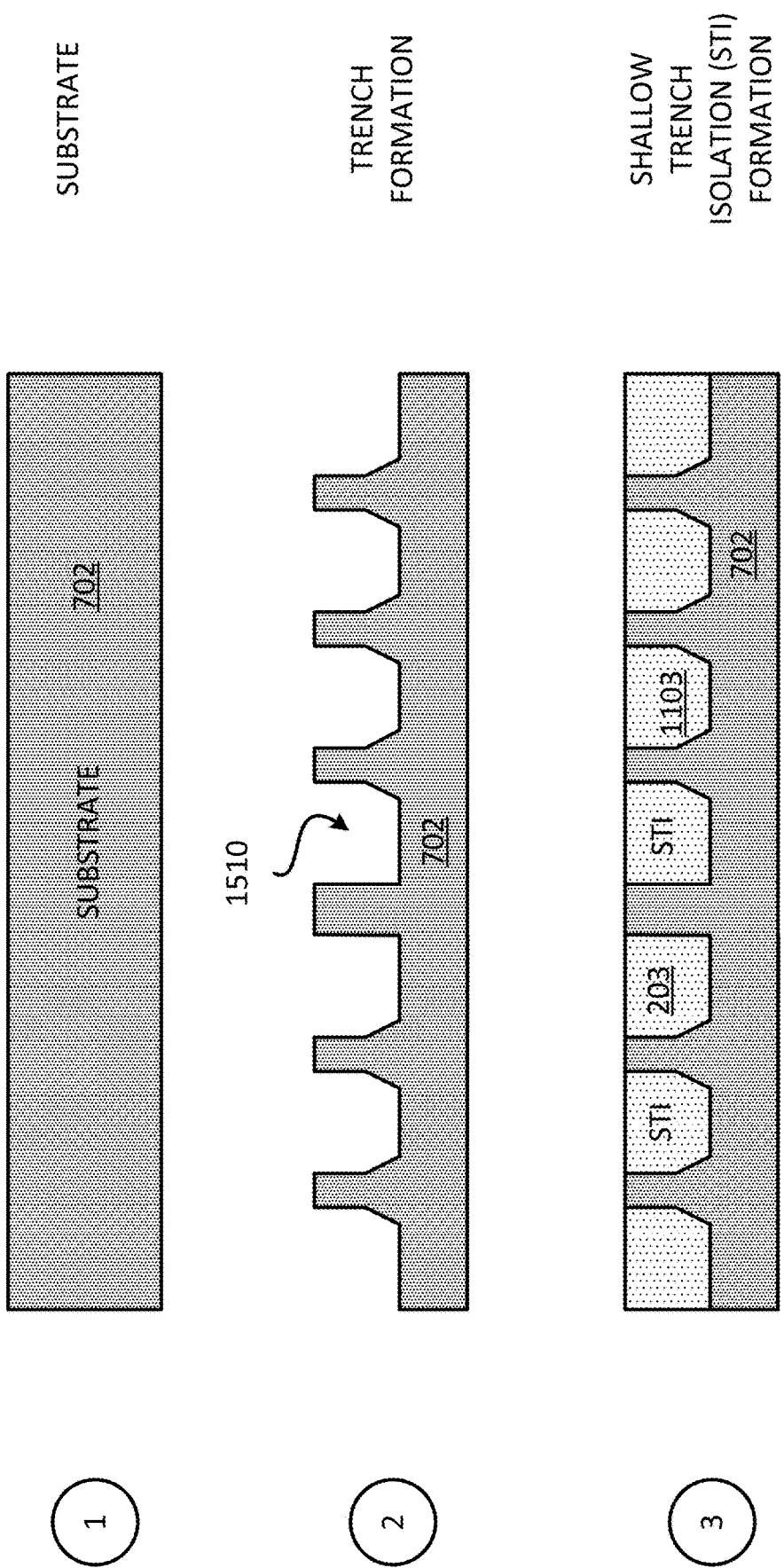
FIG. 17 (comprising FIGS. 17A-17D) illustrates an exemplary sequence for fabricating a distributed feedback (DFB) laser next to a transistor, over a substrate that includes silicon.

Stage 1, as shown in FIG. 17A, illustrates a state after a substrate 702 is provided. Different implementations may provide different materials for the substrate 702. In some implementations, the substrate 702 may include silicon (Si). In some implementations, the substrate 202 may be a semi-insulating substrate.

Stage 2 illustrates a state after trenches 1710 are formed in the substrate 702. Trench formation may include a stack deposition (e.g., oxide, nitride, resist deposition) process, a lithography process, and/or a dry etching process.

Stage 3 illustrates a state after a plurality of shallow trench isolations (STIs) 203 and 1103 are formed. STI formation may include a trench fill oxidation process, a polishing process (e.g., chemical mechanical polishing (CMP) of oxide) and/or removal of protective layer process.

Figure 17B:
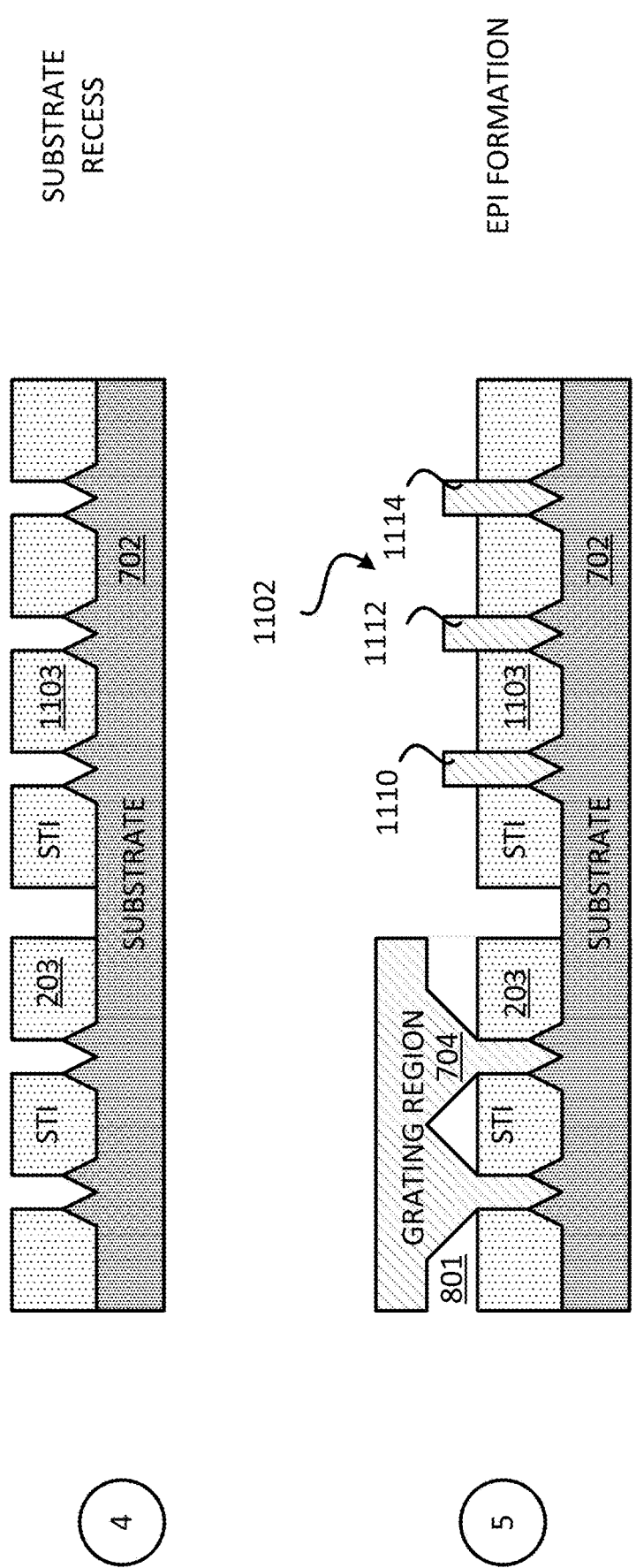

Stage 4, as shown in FIG. 17B, illustrates a state after portions of the substrate 702 are removed. In some implementations, portions of the substrate 702 that are located between (e.g., laterally between) the plurality of STIs 203 (and/or 1103) are removed. A stack deposition (e.g., oxide, nitride, resist deposition) process, a lithography process, and/or a dry etching process may be used to remove portions of the substrate 702.

Stage 5 illustrates a state after the grating region 274 are formed. An epitaxial process may be used to form the grating region 704 between the plurality of STIs 203 and over the plurality of STIs 203. The grating region 704 may be formed such that there is a void 801 between the plurality of STIs 203 and the grating region 704. The grating region 704 may be undoped. The grating region 704 may include one or more III-V semiconductor materials. The grating region 704 may include a repeating pattern of shapes and/or surfaces. For example, the grating region 704 may include a repeating pattern of ridges 240. It is noted that different implementations may use a repeating pattern with different shapes and/or sizes.

Stage 5 may also illustrate a state after a transistor 1102 is formed over the substrate 702 and the plurality of STIs 1103. The transistor 1102 may include a base 1110, an emitter 1112 and a collector 1114. The base 1110, the emitter 1112 and the collector 1114 may include the same materials as the grating region 704. The base 1110, the emitter 1112 and the collector 1114 may be formed in parallel with the grating region 704. Additional components may be formed over the base 1110, the emitter 1112 and the collector 1114. However, for purposes of clarity, these additional components may not be shown.

Figure 17C:
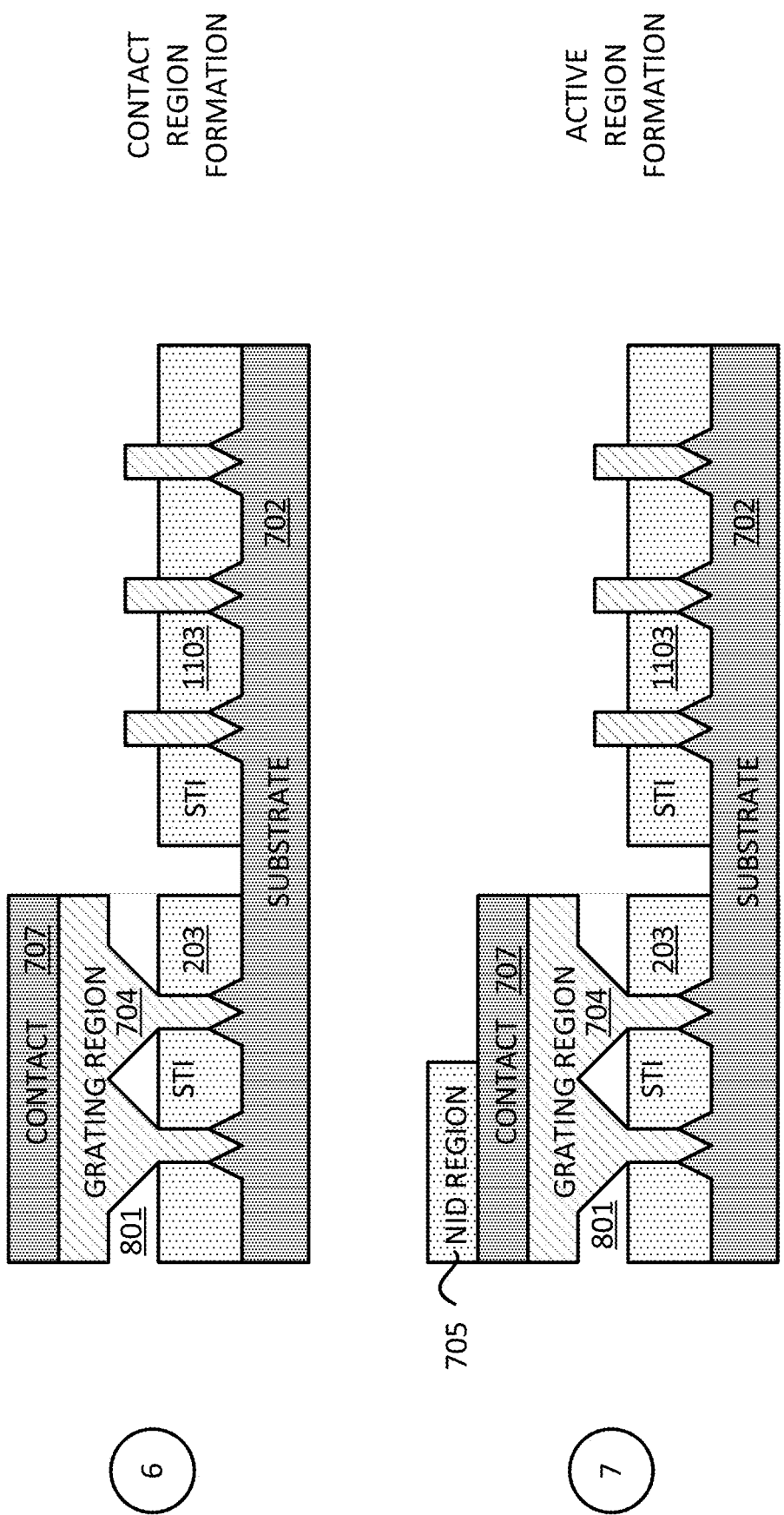

Stage 6, as shown in FIG. 17C, illustrates a state a first contact region 707 is formed over the grating region 704. An epitaxial process may be used to form the first contact region 707. The first contact region 707 may include a N type dopant or a P type dopant. The first contact region 707 may include one or more III-V semiconductor materials. Additional components may be formed over the base 1110, the emitter 1112 and the collector 1114. However, for purposes of clarity, these additional components may not be shown.

Stage 7 illustrates a state after the NID region 705 is formed over the first contact region 707. An epitaxial process may be used to form the NID region 705. The NID region 705 may be undoped or doped. The NID region 705 may include a N type dopant or a P type dopant. The NID region 705 may include at least one QW structure or at least one QD structure. The NID region 705 may include one or more III-V semiconductor materials. Additional components may be formed over the base 1110, the emitter 1112 and the collector 1114. However, for purposes of clarity, these additional components may not be shown.

Figure 17D:
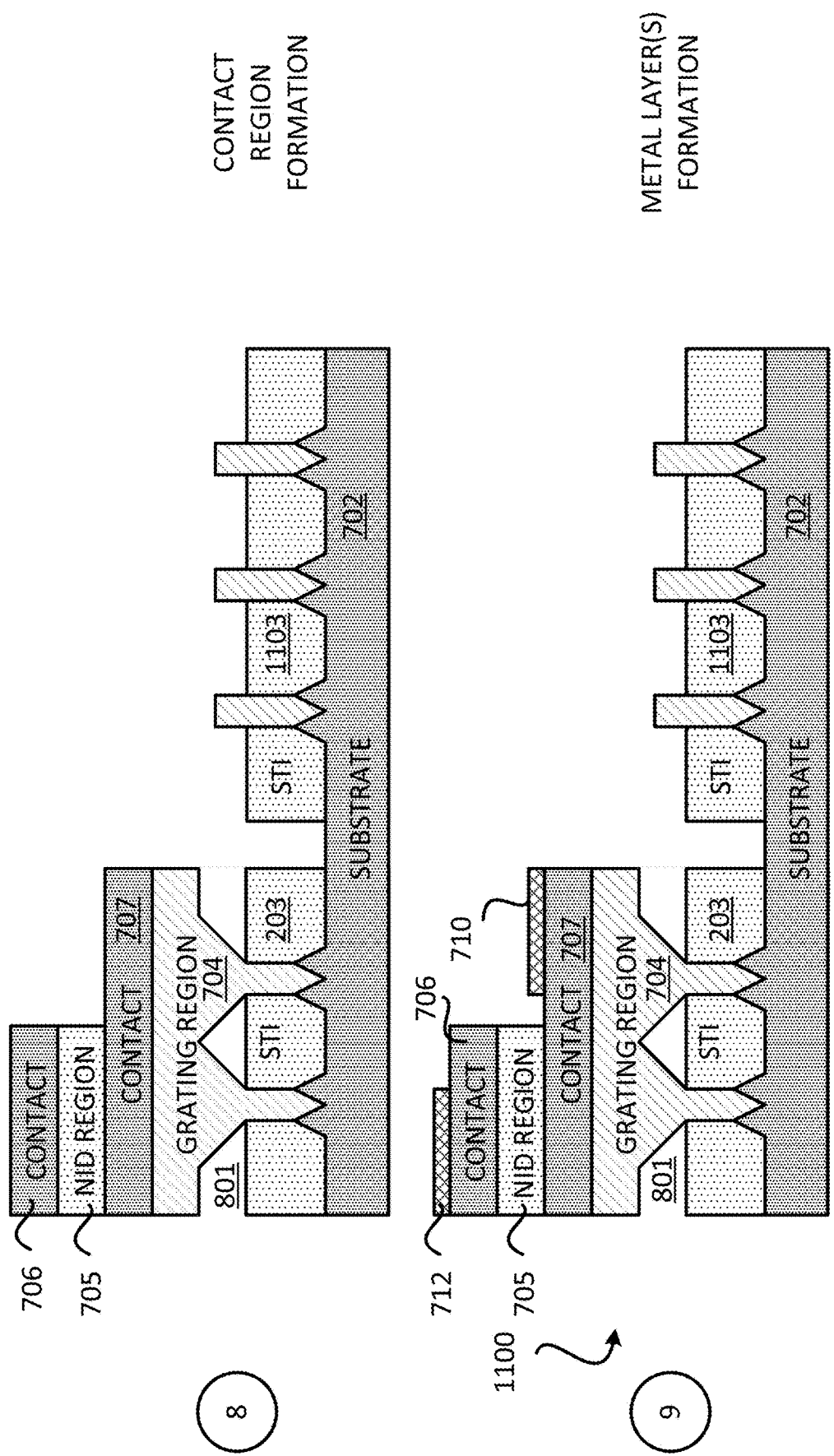

Stage 8, as shown in FIG. 17D, illustrates a state after the second contact region 706 is formed over the NID region 705. An epitaxial process may be used to form the second contact region 706. The second contact region 706 may include a N type dopant or a P type dopant. The second contact region 706 may include one or more III-V semiconductor materials. Additional components may be formed over the base 1110, the emitter 1112 and the collector 1114. However, for purposes of clarity, these additional components may not be shown.

Stage 9 illustrates a state after the first metal layer 710 and the second metal layer 712 are formed. The first metal layer 710 may be formed over the first contact region 707 by a plating process. The second metal layer 712 may be formed over the second contact region 706 by a plating process. In some implementations, the first metal layer 710 and/or the second metal layer 712 may be formed using a different process, such as sputtering process. Additional components may be formed over the base 1110, the emitter 1112 and the collector 1114. However, for purposes of clarity, these additional components may not be shown. Stage 9 may illustrate the transistor 1102 and the DFB laser 700. In some implementations, depending on the dopants that are used on the various regions, Stage 9 may illustrate the device 1100, 1200, 1300 or 1400.

For the purpose of clarity, not all components of the transistor 1102 are shown in Stages 5-9 of FIGS. 17B-17D. Thus, it is noted that the transistor 1102 may include other components that are not shown in Stages 5-9 of FIGS. 17B-17D.

Figure 18:
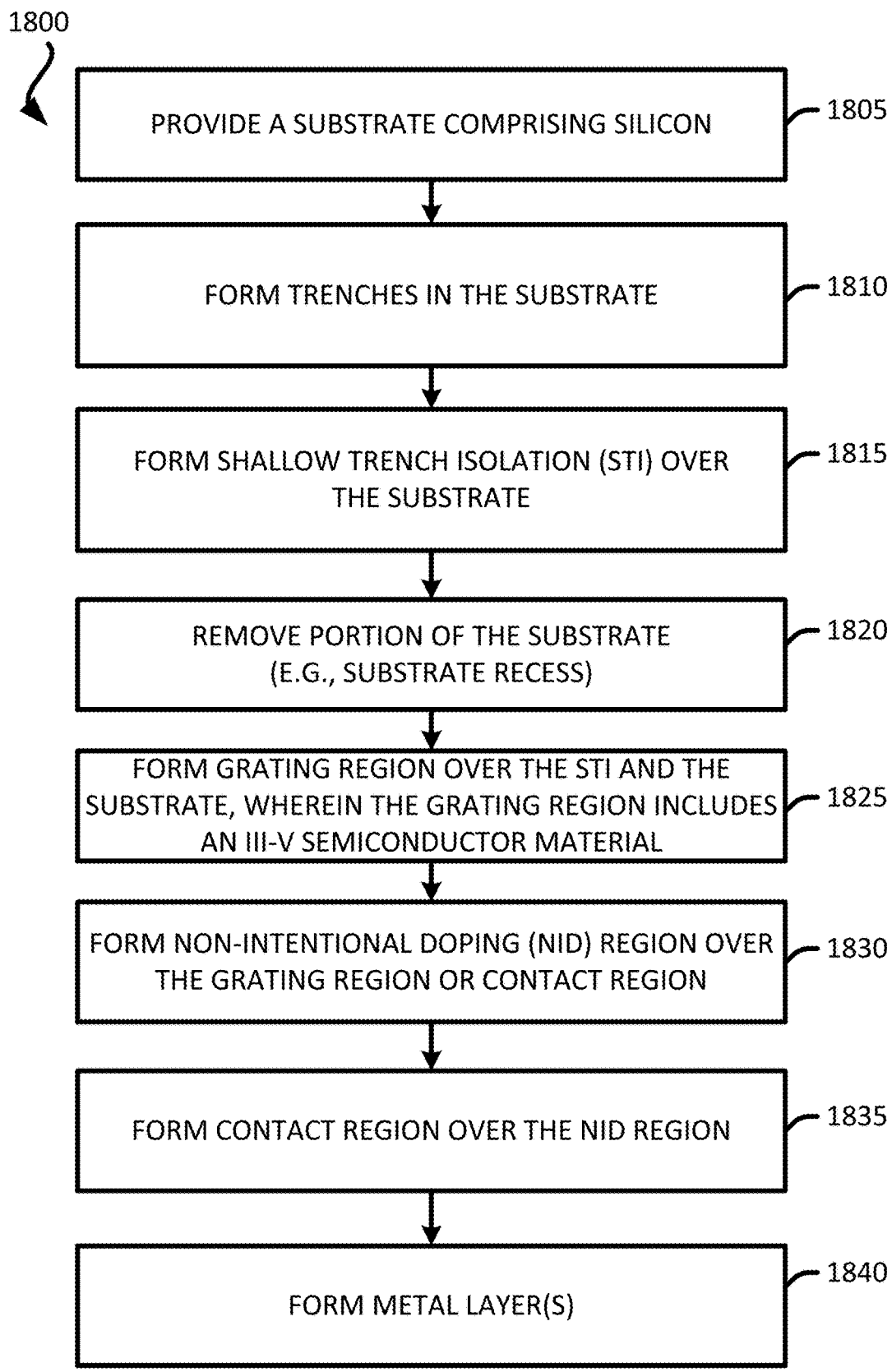
FIG. 18 illustrates an exemplary flow diagram of a method for fabricating a distributed feedback (DFB) laser comprising a substrate that includes silicon.

Exemplary Flow Diagram of a Method for Fabricating a Distributed Feedback (DFB) Laser on a Substrate Comprising Silicon In some implementations, fabricating a DFB laser includes several processes. FIG. 18 illustrates an exemplary flow diagram of a method 1800 for providing or fabricating a DFB laser. In some implementations, the method 1800 of FIG. 18 may be used to provide or fabricate the DFB laser of FIGS. 2-14 and/or other DFB lasers described in the present disclosure.

It should be noted that the sequence of FIG. 18 may combine one or more processes in order to simplify and/or clarify the method for providing or fabricating a DFB laser. In some implementations, the order of the processes may be changed or modified.

The method provides (at 1805) a substrate (e.g., 202). Different implementations may provide different materials for the substrate 202. In some implementations, the substrate 202 may include silicon (Si). In some implementations, the substrate 202 may already include dopant. In some implementations, the substrate 202 may be doped with a P type dopant or a N type dopant. In some implementations, the substrate is a semi-insulating substrate. Stage 1 of FIG. 15A illustrates an example of providing a substrate.

The method forms (at 1810) trenches (e.g., 1510) in the substrate (e.g., 202). Trench formation may include a stack deposition (e.g., oxide, nitride, resist deposition) process, a lithography process, and/or a dry etching process. Stage 2 of FIG. 15A illustrates an example of forming trenches.

The method forms (at 1815) a plurality of shallow trench isolations (STIs) (e.g., 203). STI formation may include a trench fill oxidation process, a polishing process (e.g., chemical mechanical polishing (CMP) of oxide) and/or removal of protective layer process. Stage 3 of FIG. 15A illustrates an example of forming STIs.

The method removes (at 1820) portions of the substrate (e.g., 202). In some implementations, portions of the substrate that are located between (e.g., laterally between) the plurality of STIs 203 are removed. A stack deposition (e.g., oxide, nitride, resist deposition) process, a lithography process, and/or a dry etching process may be used to remove portions of the substrate 202. Stage 4 of FIG. 15B illustrates an example of removing portions of a substrate.

The method forms (at 1825) a grating region (e.g., 204) over the STIs 203. An epitaxial (epi) process may be used to form the grating region 204 between the plurality of STIs 203 and over the plurality of STIs 203. The grating region 204 may be undoped or doped. The grating region 204 may include a N type dopant or a P type dopant. The grating region 204 may include one or more III-V semiconductor materials. In some implementations, the grating region is formed such that one or more voids are formed between the grating region and the STI 203. Stages 5-8 of FIGS. 15B-15C illustrates an example of forming a grating region.

The method forms (at 1830) a non-intentional doping (NID) region (e.g., 205). The NID region may be formed over the grating region. In some implementations, the NID region may be formed over a contact region (e.g., first contact region 707). An epitaxial process may be used to form the NID region. The NID region may be undoped or doped. The NID region may include a N type dopant or a P type dopant. The NID region may include at least one QW structure or at least one QD structure. The NID region may include one or more III-V semiconductor materials. Stage 9 of FIG. 15C illustrates an example of forming a NID region.

The method forms (at 1835) one or more contact regions. For example, the method may form the first contact region (e.g., 707) over the grating region 704. In another example, the method may form a second contact region (e.g., 706) over the NID region 705. An epitaxial process may be used to form the contact region (e.g., 707, 706). The contact region may include a N type dopant or a P type dopant. The contact region may include one or more III-V semiconductor materials. Stage 10 of FIG. 15D illustrates an example of forming a contact region.

The method forms (at 1840) the first metal layer (e.g., 210, 710) and the second metal layer (e.g., 212, 712) are formed. The first metal layer 210 may be formed over the first surface of the substrate 202 by a plating process. The second metal layer 212 may be formed over the contact region 206 by a plating process. In some implementations, the first metal layer 210 and/or the second metal layer 212 may be formed using a different process, such as sputtering process. Stage 11 of FIG. 15D illustrates an example of forming metal layers.

As mentioned above, in some implementations, a DFB laser may include one or more voids. A sequence for fabricating a DFB laser that includes one or more voids will now be described below.

Exemplary Integrated Device Comprising a Transistor and a DFB Laser

Figure 19:
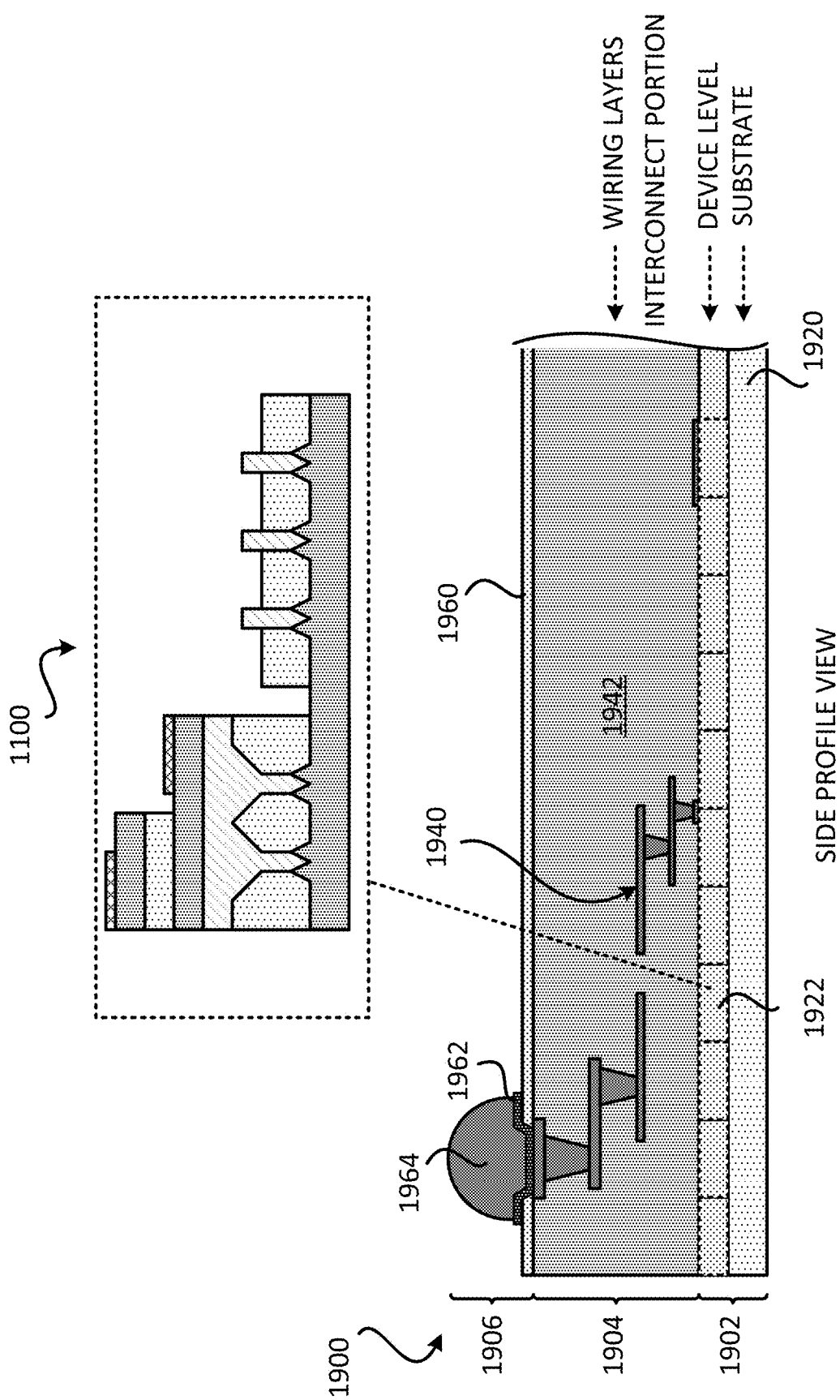
FIG. 19 illustrates a view of an integrated device that includes a distributed feedback (DFB) laser comprising a substrate that includes silicon.

FIG. 19 illustrates a profile view of an integrated device 1900 that includes a transistor and a DFB laser. The integrated device 1900 includes a substrate 1920, a plurality of device level cells 1922 (e.g., logic cells), interconnect portion 1904, and a packaging portion 1906. The plurality of device level cells 1922 is formed over the substrate 1920. The plurality of device level cells 1922 may form the device level layer of the integrated device 1900. In some implementations, the plurality of device level cells 1922 may include portions of the substrate 1920. In some implementations, the substrate 1920, the device level layer and the plurality of device level cells 1922 may be referred as the substrate portion 1902 of the integrated device 1900.

The plurality of device level cells 1922 may include one or more transistors. As shown in FIG. 19, one of the device level cells includes a device 1100, which includes the DFB laser 700 and the transistor 1102. It is noted that the integrated device 1900 may include other types of devices, structures, transistors, and/or DFB lasers, as described in the disclosure.

The interconnect portion 1904 is formed over the substrate portion 1902. In particular, the interconnect portion 1904 is formed over the plurality of device level cells 1922. The interconnect portion 1904 includes wiring layers. The interconnect portion 1904 includes a plurality of interconnects 1940 (e.g., trace, pad, vias) and at least one dielectric layer 1942. The interconnect portion 1904 may provide interconnect between the plurality of transistors and/or the DFB laser.

A packaging portion 1906 is formed over the interconnect portion 1904. The packaging portion 1906 includes a passivation layer 1960, an under bump metallization (UBM) layer 1962 and a solder interconnect 1964. It is noted that the size and shape of the integrated device 1900 is exemplary. Moreover, the components of the integrated device 1900 shown may not be to scale.

Figure 20A:
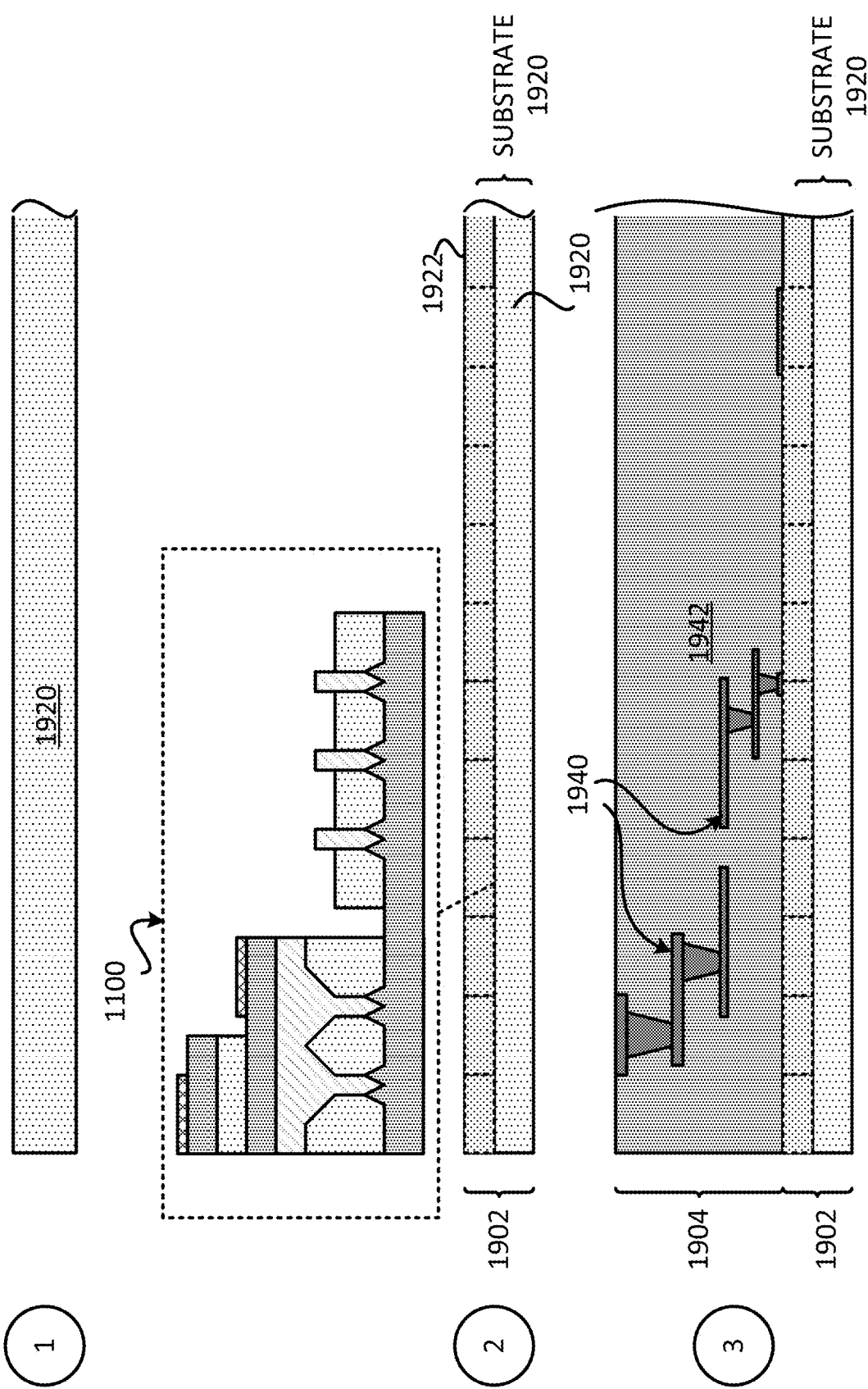
FIG. 20 (comprising FIGS. 20A-20B) illustrates an exemplary sequence for fabricating an integrated device that includes a distributed feedback (DFB) laser comprising a substrate that includes silicon.
Figure 20B:
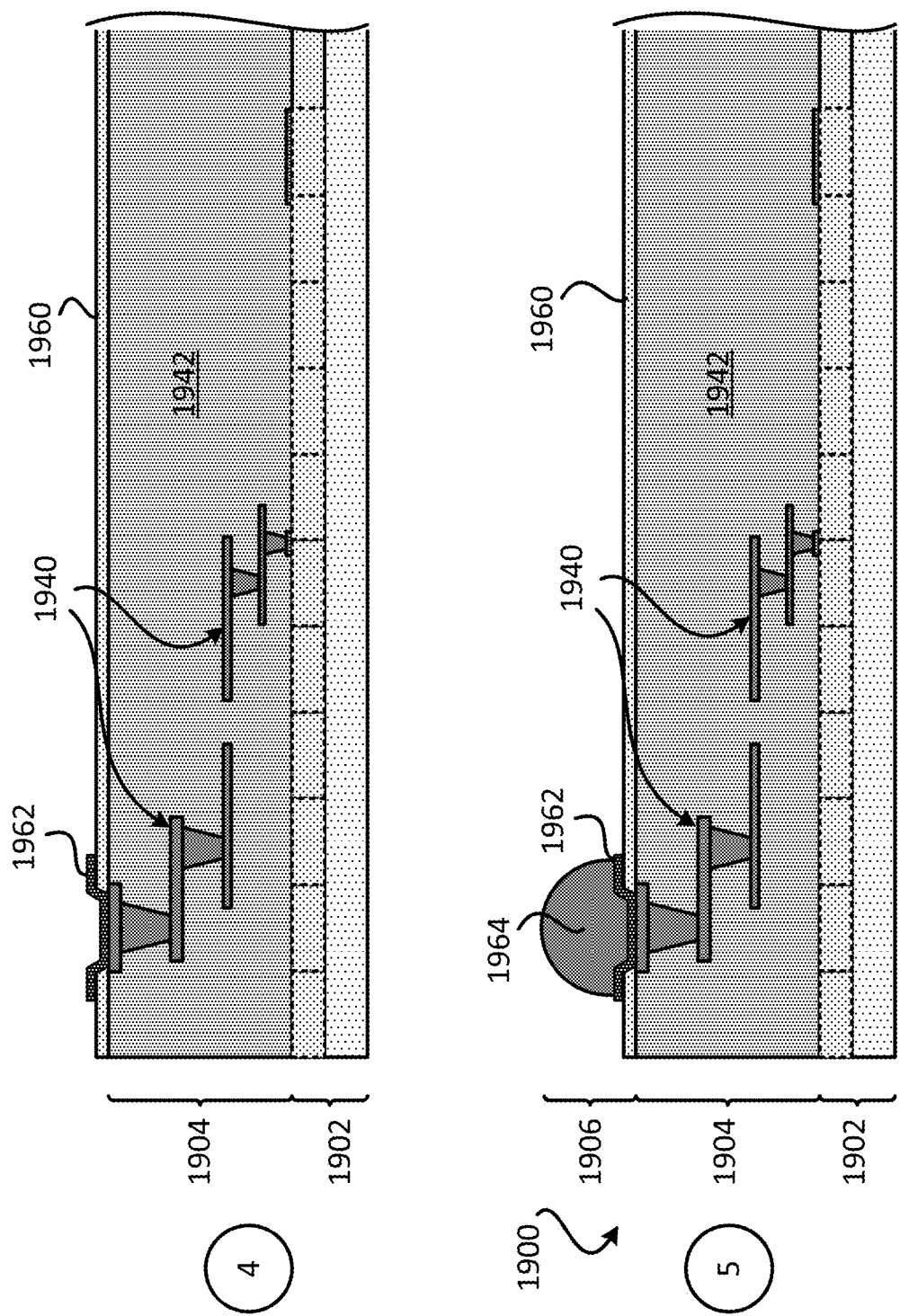

Exemplary Sequence for Fabricating an Integrated Device Comprising a Transistor and a DFB Laser In some implementations, fabricating an integrated device that includes a transistor and a DFB laser includes several processes. FIG. 20 (which includes FIGS. 20A-20B) illustrates an exemplary sequence for providing or fabricating an integrated device that includes a transistor and a DFB laser. In some implementations, the sequence of FIGS. 20A-20B may be used to provide or fabricate the integrated device of FIG. 19 and/or other integrated devices described in the present disclosure.

It should be noted that the sequence of FIGS. 20A-20B may combine one or more stages in order to simplify and/or clarify the sequence for providing or fabricating an integrated device that includes a transistor and a DFB laser. In some implementations, the order of the processes may be changed or modified. In some implementations, one or more of processes may be replaced or substituted without departing from the spirit of the disclosure.

Stage 1, as shown in FIG. 20A, illustrates a state after a substrate 1920 is provided. Different implementations may provide different materials for the substrate 1920. In some implementations, the substrate 1920 may include silicon (Si). The substrate 1920 may be doped or undoped. The substrate 1920 may be a semi-insulating substrate. The term "undoped" component as used in the disclosure may mean that the component has no dopant or may include a low doping level of a dopant. The low doping level may be a residual doping level.

Stage 2 illustrates a state after the device level layer is formed over the substrate 1920. The device level layer includes the plurality of device level cells 1922. Thus, Stage 2 illustrates a state after the plurality of device level cells 1922 is formed over the substrate 1920. In some implementations, a front end of line (FEOL) process may be used to fabricate the device level layer (e.g., plurality of device level cells 1922). One or more of cells from the plurality of device level cells may include a transistor and/or a DFB laser, as described above. FIGS. 17A-17D illustrate a sequence for fabricating a transistor and a DFB laser. In some implementations, interconnects may be formed over the gate, source and/or drain of one or more transistors, and over the metal layers of the DFB lasers.

Stage 3 illustrates a state after the interconnect portion 1904 is formed. The interconnect portion 1904 may include plurality of interconnects 1940 (located on different metal layers) and at least one dielectric layer 1942. In some implementations, a back end of line (BEOL) process may be used to fabricate interconnect portion 1904. The interconnect portion 1904 may be configured to electrically couple one or more transistors, one or more DFB lasers.

Stage 4, as shown in FIG. 20B, illustrates a state after a passivation layer 1960 and the under bump metallization (UBM) layer 1962 are formed over the interconnect portion 1904.

Stage 5 illustrates a state after a solder interconnect is coupled to the under bump metallization (UBM) layer 1962.

Figure 21:
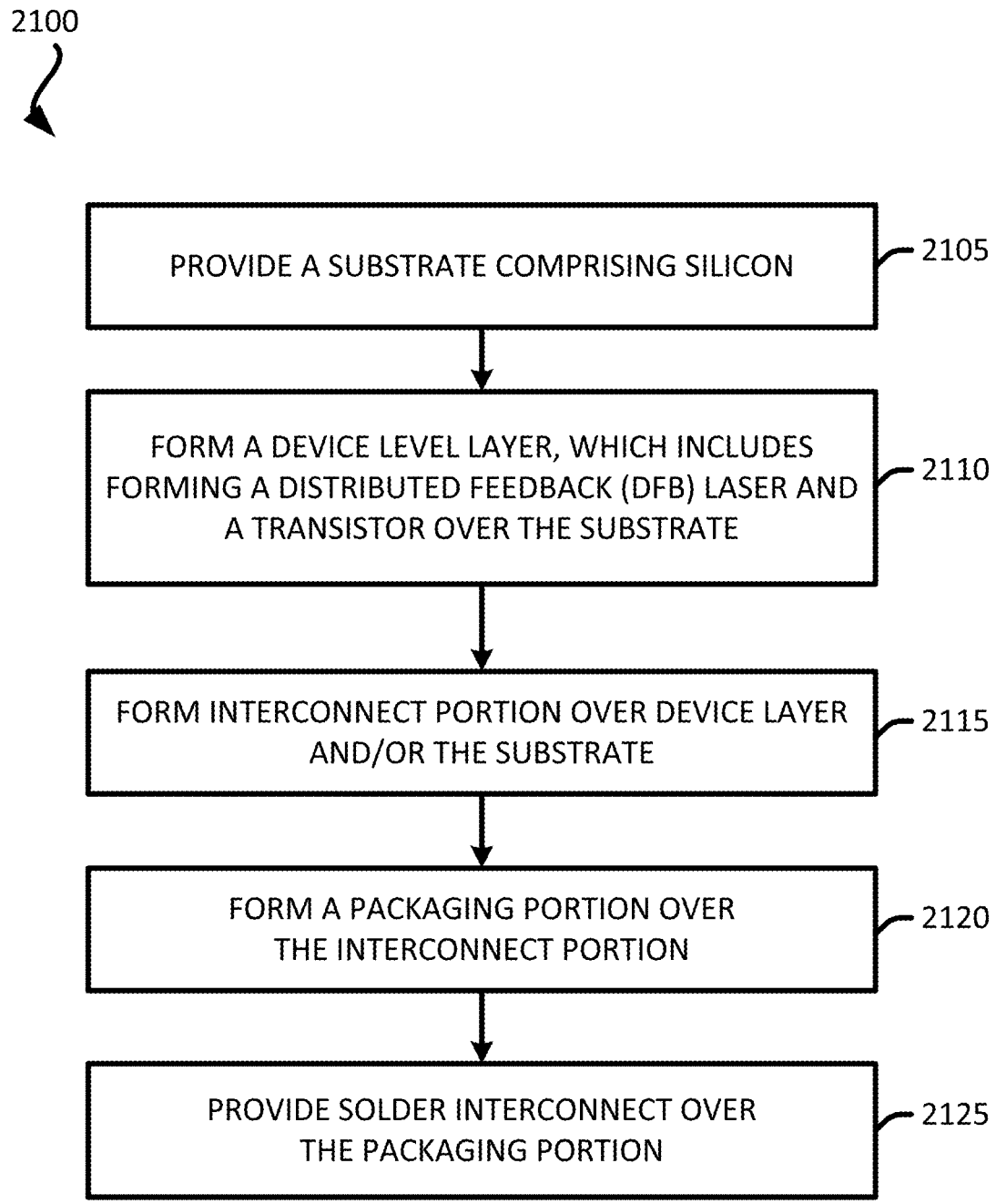
FIG. 21 illustrates an exemplary flow diagram of a method for fabricating an integrated device that includes a distributed feedback (DFB) laser comprising a substrate that includes silicon.

Exemplary Flow Diagram of a Method for Fabricating an Integrated Device Comprising a Transistor and a DFB Laser In some implementations, providing an integrated device that includes a transistor and a DFB laser includes several processes. FIG. 21 illustrates an exemplary flow diagram of a method 2100 for providing or fabricating an integrated device that includes a transistor and a DFB laser. In some implementations, the method 2100 of FIG. 21 may be used to provide or fabricate the integrated device of FIG. 19 and/or other integrated devices described in the present disclosure.

It should be noted that the method of FIG. 21 may combine one or more processes in order to simplify and/or clarify the method for providing or fabricating an integrated device that includes a transistor and a DFB laser. In some implementations, the order of the processes may be changed or modified.

The method provides (at 2105) a substrate (e.g., 1920). Different implementations may provide different materials for the substrate. In some implementations, the substrate may include silicon (Si). The substrate may be doped with an N type dopant or a P type dopant. The substrate may be a semi-insulating substrate. Stage 1 of FIG. 20A illustrates an example of providing a substrate.

The method forms (at 2110) a device level layer (e.g., the plurality of device level cells 1922) over the substrate. In some implementations, a front end of line (FEOL) process may be used to fabricate the device level layer (e.g., plurality of device level cells 1922). The device level layer may include a plurality of device level cells. The device level cells may include one or more active devices. One or more device level cells may include a transistor (e.g., 1102) and a DFB laser (e.g., 700, 800, 900), as described in the disclosure. Forming the device level layer may include forming one or more transistors and one or more DFB lasers. In some implementations, forming a device level layer includes forming a transistor over the substrate and forming a DFB laser over the substrate. Examples of forming a transistor and a DFB laser over a substrate are shown and described in FIGS. 17A-17D and Stage 2 of FIG. 20A.

The method forms (at 2115) an interconnect portion 1904 over the device level layer (e.g., plurality of device level cells 1922) and/or the substrate 1920. The interconnect portion 1904 may include a plurality of interconnect 1940 and at least one dielectric layer 1942. In some implementations, a back end of line (BEOL) process may be used to form the interconnect portion 1904. The interconnect portion 1904 may be configured to electrically couple one or more transistors, and/or one or more DFB lasers. Stage 3 of FIG. 20A illustrates an example of forming an interconnect portion 1904.

The method forms (at 2120) a packaging portion 1906 over the interconnect portion 1904. The packaging portion 1906 may include the passivation layer 1960 and the under bump metallization (UBM) layer 1962. The passivation layer 1960 and the under bump metallization (UBM) layer 1962 are formed over the interconnect portion 1904. Stage 4 of FIG. 20B illustrates an example of forming a packaging portion 1906.

The method provides (at 2125) a solder interconnect 1964. In some implementations, the solder interconnect 1964 is coupled to the under bump metallization (UBM) layer 1962. Stage 5 of FIG. 20B illustrates an example of coupling a solder interconnect to the packaging portion 1906.

It is also noted that the method 2100 of FIG. 21 may be used to fabricate (e.g., concurrently fabricate) several integrated devices on a wafer. The wafer is then singulated (e.g., cut) into individual integrated devices. These singulated integrated devices may then be coupled to other integrated devices and/or printed circuit boards (PCBs). It is noted that steps and features described in the method 2100 of FIG. 21 may be used (e.g., selectively used) in the method 1800 of FIG. 18, and vice versa.

Exemplary Electronic Devices

Figure 22:
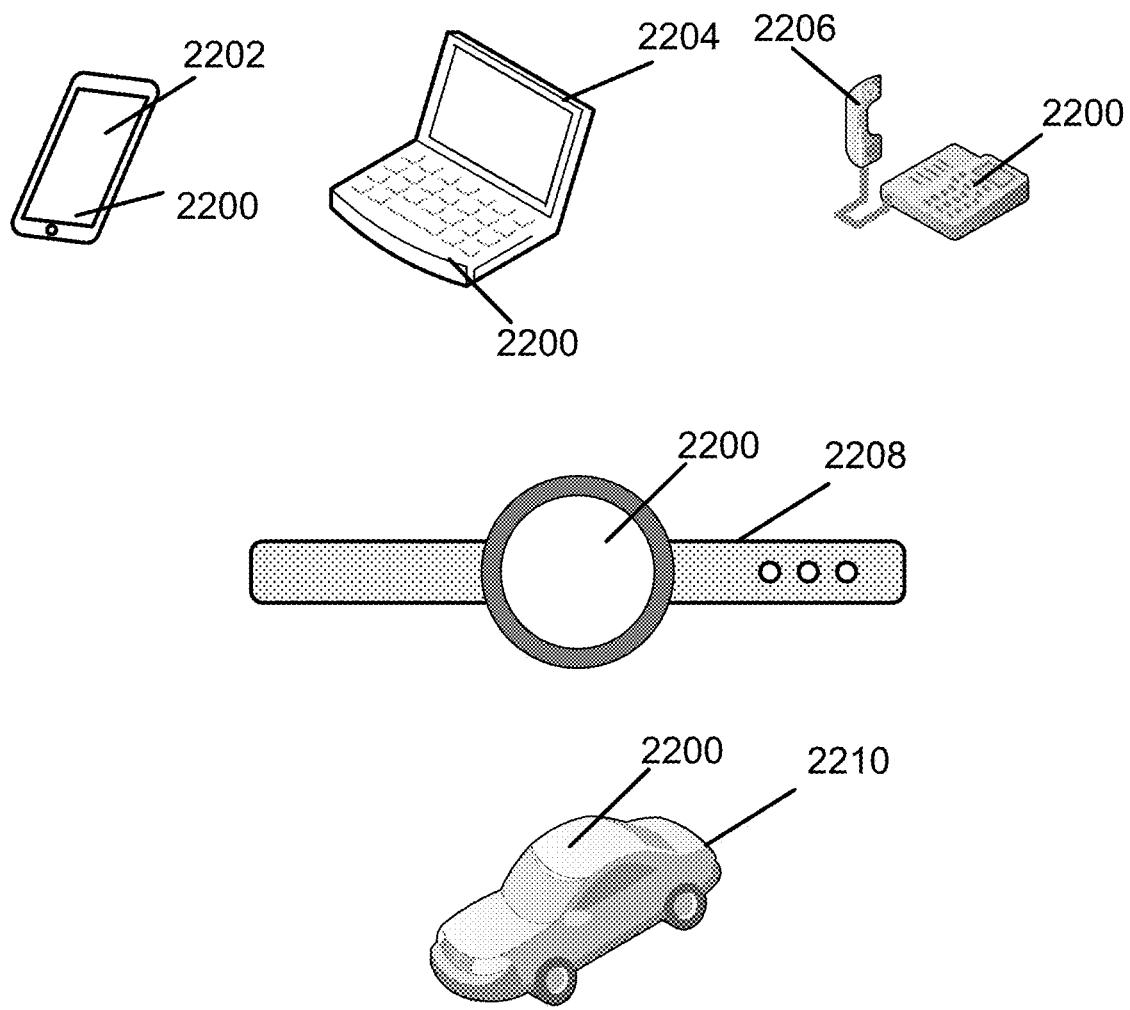
FIG. 22 illustrates various electronic devices that may integrate a die, an integrated device, an integrated passive device (IPD), a device package, a package, an integrated circuit and/or PCB described herein.

FIG. 22 illustrates various electronic devices that may be integrated with any of the aforementioned transistor, DFB laser, device, integrated device, integrated circuit (IC) package, integrated circuit (IC) device, semiconductor device, integrated circuit, die, interposer, package or package-on-package (PoP). For example, a mobile phone device 2202, a laptop computer device 2204, a fixed location terminal device 2206, or a wearable device 2208 may include a device 2200 as described herein. The device 2200 may be, for example, any of the devices and/or integrated circuit (IC) packages described herein. The devices 2202, 2204, 2206 and 2208 illustrated in FIG. 22 are merely exemplary. Other electronic devices may also feature the device 2200 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

One or more of the components, processes, features, and/or functions illustrated in FIGS. 2-14, 15A-15D, 16A-16C, 17A-17D, 18, 19, 20A-20B and/or 21-22 may be rearranged and/or combined into a single component, process, feature or function or embodied in several components, processes, or functions. Additional elements, components, processes, and/or functions may also be added without departing from the disclosure. It should also be noted FIGS. 2-14, 15A-15D, 16A-16C, 17A-17D, 18, 19, 20A-20B and/or 21-22 and its corresponding description in the present disclosure is not limited to dies and/or ICs. In some implementations, FIGS. 2-14, 15A-15D, 16A-16C, 17A-17D, 18, 19, 20A-20B and/or 21-22 and its corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (PoP) device, and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel or is capable of traveling between the two objects. Two objects that are electrically coupled may or may not have an electrical current traveling between the two objects. The term "encapsulating" means that the object may partially encapsulate or completely encapsulate another object. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of, directly touching) the second component, and/or (3) the first component is in (e.g., embedded in) the second component. The term etching may include dry etching or wet etching, and may involve the use of a mask. Forming or disposing a metal may include a plating process, a chemical vapor deposition (CVP) process, and/or an atomic layer deposition (ALD) process. In some implementations, forming one or more dielectric layers may include one or more deposition processes.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

Further examples of the present disclosure are provided in the following paragraphs:

A distributed feedback (DFB) laser that includes a substrate comprising a first surface and a second surface, wherein the substrate comprises silicon; a plurality of shallow trench isolations (STIs) located over (e.g., directly touching) the second surface of the substrate; a grating region located over (e.g., directly touching) the plurality of STIs and the substrate, wherein the grating region comprises an III-V semiconductor material; a non-intentional doping (NID) region located over (e.g., directly touching) the grating region; and a contact region located over (e.g., directly touching) the NID region. The III-V semiconductor material includes Gallium Arsenide (GaAs) and/or Indium Phosphide (InP). The NID region is configured as a waveguide. The DFB laser may further comprise a first metal layer located over (e.g., directly touching) the first surface of the substrate; and a second metal layer located over (e.g., directly touching) the contact region, wherein the contact region is configured to provide a contact for the second metal layer. The grating region includes a N type dopant or a P type dopant. The substrate may include a N type silicon. The grating region may include a P type dopant. The contact region may include a N type dopant. The grating region may include Gallium Arsenide (GaAs) doped with a P type dopant. The contact region may include GaAs doped with a N type dopant. The grating region may include Indium Phosphide (InP) doped with a P type dopant. The contact region may include InP doped with a N type dopant. The substrate may include a P type silicon. The grating region may include a N type dopant. The contact region may include a P type dopant. The grating region may include Gallium Arsenide (GaAs) doped with a N type dopant, and the contact region may include GaAs doped with a P type dopant. The grating region may include Indium Phosphide (InP) doped with a N type dopant, and the contact region may include InP doped with a P type dopant. The NID region may include Gallium Arsenide GaAs and/or Aluminum Gallium Arsenide (AlGaAs). The NID region may include a quantum well (QW) structure and/or a quantum dot (QD) structure. The DFB laser may further include at least one void located between the NID region and the plurality of STIs. The DFB laser may further comprise a region located between the grating region and the NID region, wherein the region comprises an III-V semiconductor material, wherein the grating region is undoped, wherein the region comprises a N type dopant, wherein the contact region comprises a P type dopant. The grating region, the region, and the contact region may include Gallium Arsenide (GaAs) and/or Indium Phosphide (InP). The grating region may be undoped, the region may comprise a P type dopant, the contact region may comprise a N type dopant, wherein the grating region, the region, and the contact region include Gallium Arsenide (GaAs) and/or Indium Phosphide (InP). The substrate may comprise silicon that is semi-insulating. The DFB laser may further comprise at least one void located between the NID region and the plurality of STIs. The DFB laser may further comprise a first metal layer located over (e.g., directly touching) the region; and a second metal layer located over (e.g., directly touching) the contact region. The grating region may comprise a plurality of repeating ridges. The DFB laser may be incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

An integrated device that includes a substrate comprising a first surface and a second surface, wherein the substrate comprises silicon; a distributed feedback (DFB) laser located over (e.g., directly touching) the substrate, the DFB laser comprising: a plurality of shallow trench isolations (STIs) located over (e.g., directly touching) the second surface of the substrate; a grating region located over (e.g., directly touching) the plurality of STIs and the substrate, wherein the grating region comprises an III-V semiconductor material; a non-intentional doping (NID) region located over (e.g., directly touching) the grating region; and a contact region located over (e.g., directly touching) the NID region; and a transistor located over (e.g., directly touching) the substrate. The transistor may include a heterojunction bipolar transistor (HBT), wherein the transistor includes an emitter, a base and a collector. The transistor may include a high electron mobility transistor (HEMT).

An apparatus that includes a substrate comprising a first surface and a second surface, wherein the substrate comprises silicon; a distributed feedback (DFB) laser located over the substrate, the DFB laser comprising: a plurality of shallow trench isolations (STIs) located over the second surface of the substrate; means for refractive grating located over the plurality of STIs and the substrate, wherein the means for refractive grating comprises an III-V semiconductor material; a non-intentional doping (NID) region located over the means for refractive grating; and a contact region located over the NID region; and a transistor located over the substrate. The transistor may include a heterojunction bipolar transistor (HBT). The transistor may include a high electron mobility transistor (HEMT).

A method for fabricating a distributed feedback (DFB) laser, comprising: providing a substrate comprising silicon; forming a plurality of shallow trench isolations (STIs) over the substrate; forming a grating region over the plurality of STIs and the substrate, wherein the grating region comprises an III-V semiconductor material; forming a non-intentional doping (NID) region over the grating region; and forming a contact region over the NID region. The III-V semiconductor material may include Gallium Arsenide (GaAs) and/or Indium Phosphide (InP). The NID region may be configured as a waveguide. The method further comprising: forming a first metal layer over the substrate; and forming a second metal layer over the contact region, wherein the contact region is configured to provide a contact for the second metal layer.

What is claimed is:

1. A distributed feedback (DFB) laser comprising:
   a substrate comprising a first surface and a second surface, wherein the substrate comprises silicon;
   a plurality of shallow trench isolations (STIs) located over the second surface of the substrate;
   a grating region located over the plurality of STIs and the substrate,
      wherein the grating region comprises an III-V semiconductor material,
      wherein the grating region comprises a plurality of diagonal surfaces, and
      wherein the plurality of diagonal surfaces are diagonal relative to the second surface of the substrate;
   a non-intentional doping (MD) region located over the grating region; and
   a contact region located over the NID region.

2. The DFB laser of claim 1, wherein the III-V semiconductor material includes Gallium Arsenide (GaAs) and/or Indium Phosphide (InP).

3. The DFB laser of claim 1, wherein the MD region is configured as a waveguide.

4. The DFB laser of claim 1, further comprising:
   a first metal layer located over the first surface of the substrate; and
   a second metal layer located over the contact region, wherein the contact region is configured to provide a contact for the second metal layer.

5. The DFB laser of claim 1, wherein the grating region includes a N type dopant or a P type dopant.

6. The DFB laser of claim 1,
   wherein the substrate includes a N type silicon,
   wherein the grating region includes a P type dopant, and
   wherein the contact region includes a P type dopant.

7. The DFB laser of claim 6,
   wherein the grating region includes Gallium Arsenide (GaAs) doped with a P type dopant, and
   wherein the contact region includes GaAs doped with a P type dopant.

8. The DFB laser of claim 6,
   wherein the grating region includes Indium Phosphide (InP) doped with a P type dopant, and
   wherein the contact region includes InP doped with a P type dopant.

9. The DFB laser of claim 1,
   wherein the substrate includes a P type silicon,
   wherein the grating region includes a N type dopant, and
   wherein the contact region includes a N type dopant.

10. The DFB laser of claim 9,
    wherein the grating region includes Gallium Arsenide (GaAs) doped with a N type dopant, and
    wherein the contact region includes GaAs doped with a N type dopant.

11. The DFB laser of claim 9,
    wherein the grating region includes Indium Phosphide (InP) doped with a N type dopant, and
    wherein the contact region includes InP doped with a N type dopant.

12. The DFB laser of claim 1, wherein the NID region includes Gallium Arsenide (GaAs) and/or Aluminum Gallium Arsenide (AlGaAs).

13. The DFB laser of claim 1, wherein the NID region includes a quantum well (QW) structure and/or a quantum dot (QD) structure.

14. The DFB laser of claim 1, further comprising at least one void located between the NID region and the plurality of STIs.

15. The DFB laser of claim 1, further comprising a region located between the grating region and the NID region, wherein the region comprises an III-V semiconductor material.

16. The DFB laser of claim 15,
    wherein the grating region is undoped,
    wherein the region comprises a N type dopant,
    wherein the contact region comprises a P type dopant.

17. The DFB laser of claim 16, wherein the grating region, the region, and the contact region include Gallium Arsenide (GaAs) and/or Indium Phosphide (InP).

18. The DFB laser of claim 15,
    wherein the grating region is undoped,
    wherein the region comprises a P type dopant,
    wherein the contact region comprises a N type dopant.

19. The DFB laser of claim 18, wherein the grating region, the region, and the contact region include Gallium Arsenide (GaAs) and/or Indium Phosphide (InP).

20. The DFB laser of claim 15, wherein the substrate comprising silicon is semi-insulating.

21. The DFB laser of claim 15, further comprising at least one void located between the NID region and the plurality of STIs.

22. The DFB laser of claim 15, further comprising:
    a first metal layer located over the region; and
    a second metal layer located over the contact region.

23. The DFB laser of claim 1, wherein the grating region comprises a plurality of repeating ridges.

24. The DFB laser of claim 1, wherein the DFB laser is incorporated into a device selected from a group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

25. An integrated device comprising:
a substrate comprising a first surface and a second surface, wherein the substrate comprises silicon;
a distributed feedback (DFB) laser located over the substrate, the DFB laser comprising:
a plurality of shallow trench isolations (STIs) located over the second surface of the substrate;
a grating region located over the plurality of STIs and the substrate,
wherein the grating region comprises an III-V semiconductor material,
wherein the grating region comprises a plurality of diagonal surfaces, and
wherein the plurality of diagonal surfaces are diagonal relative to the second surface of the substrate;
a non-intentional doping (MD) region located over the grating region; and
a contact region located over the MD region; and
a transistor located over the substrate.

26. The integrated device of claim 25, wherein the transistor includes a heterojunction bipolar transistor (HBT).

27. The integrated device of claim 25, wherein the transistor includes an emitter, a base and a collector.

28. The integrated device of claim 25, wherein the transistor includes a high electron mobility transistor (HEMT).

29. An apparatus comprising:
a substrate comprising a first surface and a second surface, wherein the substrate comprises silicon;
a distributed feedback (DFB) laser located over the substrate, the DFB laser comprising:
a plurality of shallow trench isolations (STIs) located over the second surface of the substrate;
means for refractive grating located over the plurality of STIs and the substrate,
wherein the means for refractive grating comprises an III-V semiconductor material,
wherein the means for refractive grating comprises a plurality of diagonal surfaces, and
wherein the plurality of diagonal surfaces are diagonal relative to the second surface of the substrate;
a non-intentional doping (MD) region located over the means for refractive grating; and
a contact region located over the ND region; and
a transistor located over the substrate.

30. The apparatus of claim 29, wherein the transistor includes a heterojunction bipolar transistor (HBT).

31. The apparatus of claim 29, wherein the transistor includes a high electron mobility transistor (HEMT).

32. A method for fabricating a distributed feedback (DFB) laser, comprising:
providing a substrate comprising silicon, wherein the substrate comprises a first surface and a second surface;
forming a plurality of shallow trench isolations (STIs) over the second surface of the substrate;
forming a grating region over the plurality of STIs and the substrate,
wherein the grating region comprises an III-V semiconductor material,
wherein the grating region is formed such that the granting region comprises a plurality of diagonal surfaces, and
wherein the plurality of diagonal surfaces are diagonal relative to the second surface of the substrate;
forming a non-intentional doping (NID) region over the grating region; and
forming a contact region over the NID region.

33. The method of claim 32, wherein the III-V semiconductor material includes Gallium Arsenide (GaAs) and/or Indium Phosphide (InP).

34. The method of claim 32, wherein the NID region is configured as a waveguide.

35. The method of claim 32, further comprising:
forming a first metal layer over the substrate; and
forming a second metal layer over the contact region,
wherein the contact region is configured to provide a contact for the second metal layer.

* * * * *